US009496222B2

(12) United States Patent
Kon et al.

(10) Patent No.: US 9,496,222 B2
(45) Date of Patent: Nov. 15, 2016

(54) SEMICONDUCTOR DEVICE INCLUDING INSULATING FILMS WITH DIFFERENT MOISTURE RESISTANCES AND FABRICATION METHOD THEREOF

(71) Applicant: FUJITSU LIMITED, Kawasaki-shi, Kanagawa (JP)

(72) Inventors: Junichi Kon, Isehara (JP); Yoshihiro Nakata, Atsugi (JP); Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/173,906

(22) Filed: Feb. 6, 2014

(65) Prior Publication Data

US 2014/0264826 A1 Sep. 18, 2014

(30) Foreign Application Priority Data

Mar. 18, 2013 (JP) .................................. 2013-055227

(51) Int. Cl.
*H01L 23/52* (2006.01)
*H01L 23/532* (2006.01)
(Continued)

(52) U.S. Cl.
CPC ....... *H01L 23/5329* (2013.01); *H01L 21/0272* (2013.01); *H01L 21/02126* (2013.01); *H01L 21/02216* (2013.01); *H01L 21/02282* (2013.01); *H01L 21/0331* (2013.01);
(Continued)

(58) Field of Classification Search
CPC ........... H01L 23/485; H01L 21/76832; H01L 23/5329; H01L 21/28587; H01L 21/02282; H01L 21/0331; H01L 21/02126; H01L 29/42316; H01L 29/66462; H01L 23/5222; H01L 29/2003
See application file for complete search history.

(56) References Cited

U.S. PATENT DOCUMENTS 5,989,992 A * 11/1999 Yabu .................. H01L 23/5222
257/E23.02
6,030,706 A 2/2000 Eissa et al.
(Continued)

FOREIGN PATENT DOCUMENTS

JP 60-034022 2/1985
JP 06-168962 6/1994
(Continued)

OTHER PUBLICATIONS

Hauptmann, "Plasma-deposited passivation layers for moisture and water protection", Surface and Coatings Technology, vol. 74-75, Elsevier, 1995, pp. 676-681.*
(Continued)

*Primary Examiner* — William Coleman
(74) *Attorney, Agent, or Firm* — Fujitsu Patent Center

(57) ABSTRACT

A semiconductor device has a structure including a substrate, a first insulating film formed over a part of a principal plane of the substrate, a conductive portion formed over a surface of the first insulating film, and a second insulating film which covers the principal plane of the substrate, the first insulating film, and the conductive portion and whose moisture resistance is higher than moisture resistance of the first insulating film. The first insulating film is placed between the substrate and the conductive portion to prevent the generation of parasitic capacitance. The first insulating film is covered with the second insulating film whose moisture resistance is higher than the moisture resistance of the first insulating film. The second insulating film prevents the first insulating film from absorbing moisture.

10 Claims, 34 Drawing Sheets

(51) Int. Cl.
*H01L 23/522* (2006.01)
*H01L 29/423* (2006.01)
*H01L 29/66* (2006.01)
*H01L 21/02* (2006.01)
*H01L 21/027* (2006.01)
*H01L 21/033* (2006.01)
*H01L 21/285* (2006.01)
*H01L 29/20* (2006.01)

(52) U.S. Cl.
CPC .... *H01L 21/28587* (2013.01); *H01L 23/5222* (2013.01); *H01L 29/42316* (2013.01); *H01L 29/66462* (2013.01); *H01L 29/2003* (2013.01); *H01L 2924/0002* (2013.01)

(56) References Cited

U.S. PATENT DOCUMENTS

| | | | |
|---|---|---|---|
| 6,365,521 B1* | 4/2002 | Shubert et al. | 438/691 |
| 6,514,881 B1* | 2/2003 | Coffman | H01L 21/02126 257/E21.269 |
| 8,063,420 B2* | 11/2011 | Amasuga | 257/280 |
| 2010/0052062 A1 | 3/2010 | Fukui et al. | |
| 2010/0219454 A1 | 9/2010 | Amasuga | |
| 2011/0057232 A1 | 3/2011 | Sheppard et al. | |

FOREIGN PATENT DOCUMENTS

| | | |
|---|---|---|
| JP | 08-291733 | 11/1996 |
| JP | 10-092817 | 4/1998 |
| JP | 10-144670 | 5/1998 |
| JP | 11-233527 | 8/1999 |
| JP | 2000-124228 | 4/2000 |
| JP | 2001-085448 | 3/2001 |
| JP | 2006-278506 | 10/2006 |
| JP | 2008-244001 | 10/2008 |
| JP | 2009-283915 | 12/2009 |
| JP | 2010-010489 | 1/2010 |
| JP | 2010-056156 | 3/2010 |
| JP | 2010-192500 | 9/2010 |
| JP | 2010-205837 | 9/2010 |
| JP | 2012-053243 | 3/2012 |

OTHER PUBLICATIONS

Stuardo Robles, Ellie Yieh, Bang C. Nguyen, "Moisture Resistance of Plasma Enhanced Chemical Vapor Deposited Oxides Used for Ultralarge Scale Integrated Device Applications", Journal of the Electrochemical Society, vol. 142, No. 2, Feb. 1995, pp. 580-585.*
CNOA—Chinese Office Action issued on May 5, 2016 for corresponding Chinese Application No. 201410066965.0.
TWOA—Taiwanese Office Action for corresponding Taiwan Application No. 103104052, dated Jan. 18, 2016, with English translation.
JPOA—Office Action mailed Aug. 9, 2016 for corresponding Japanese Application No. 2013-055227, with English translation of relevant part: p. 1 line 21 to p. 3 line 3.

* cited by examiner

SEMICONDUCTOR DEVICE INCLUDING INSULATING FILMS WITH DIFFERENT MOISTURE RESISTANCES AND FABRICATION METHOD THEREOF

CROSS-REFERENCE TO RELATED APPLICATION

This application is based upon and claims the benefit of priority of the prior Japanese Patent Application No. 2013-055227, filed on Mar. 18, 2013, the entire contents of which are incorporated herein by reference.

FIELD

The embodiment discussed herein is related to a semiconductor device and a semiconductor device fabrication method.

BACKGROUND

The technique of using an insulating film made of silicon oxide (SiO), silicon nitride (SiN), or the like for insulating conductive portions in a semiconductor device from each other is known. Furthermore, the technique of using a comparatively low dielectric constant insulating film (which is referred to as, for example, a low-k film) for reducing parasitic capacitance generated between conductive portions is also known.

The method of forming an insulating film over a foundation substrate or layer, forming a determined opening portion in the insulating film by photolithography and etching, and forming a conductive portion, such as a wiring, in the formed opening portion is widely used in the field of semiconductor device production. In addition, the technique of using a photosensitive composition after exposure and development as an insulating film (pattern film) is also known.

Japanese Laid-open Patent Publication No. 2010-056156
Japanese Laid-open Patent Publication No. 2006-278506
Japanese Laid-open Patent Publication No. 2012-053243

A comparatively low dielectric constant insulating film has low film density and low moisture resistance, compared with a higher dielectric constant insulating film. As a result, such an insulating film tends to absorb moisture. Even if a low dielectric constant insulating film is used in order to reduce parasitic capacitance, such moisture absorption may cause deterioration in the performance or reliability of a semiconductor device.

SUMMARY

According to an aspect, there is provided a semiconductor device including a substrate, a first insulating film formed over a part of a first plane of the substrate, a first conductive portion formed over a surface of the first insulating film, and a second insulating film which covers the first plane, the first insulating film, and the first conductive portion and whose moisture resistance is higher than moisture resistance of the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
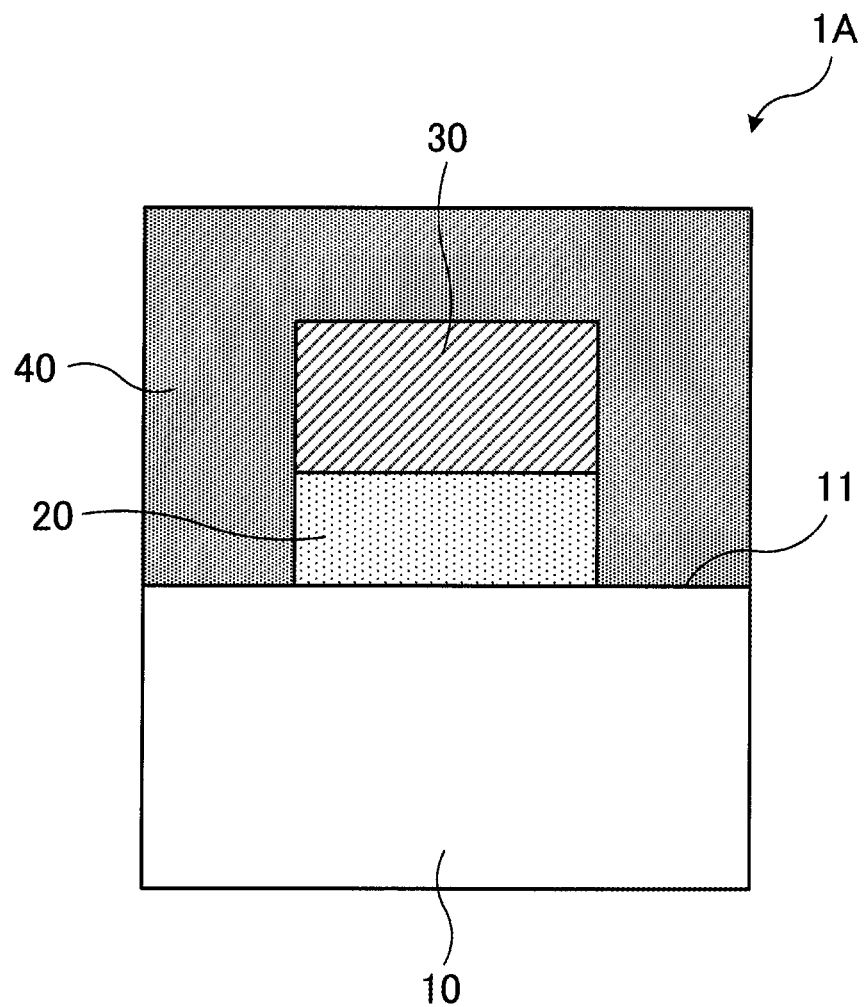
FIG. 1 is a fragmentary schematic sectional view of a first example of a semiconductor device.

FIG. 1 is a fragmentary schematic sectional view of a first example of a semiconductor device.

A semiconductor device includes a substrate 10, an insulating film 20 formed over a part of one principal plane 11 of the substrate 10, and a conductive portion 30 formed over the insulating film 20 and has a structure 1A in which the principal plane 11, the insulating film 20, and the conductive portion 30 are covered with an insulating film 40.

The substrate 10 is, for example, a semiconductor substrate, a compound semiconductor substrate, or a substrate over which a semiconductor layer or a compound semiconductor layer is formed as a surface layer. The insulating film 20 is an insulating film (low-k film) whose dielectric constant and moisture resistance are low compared with the insulating film 40. The insulating film 20 is, for example, a porous insulating film. The conductive portion 30 is formed by the use of various conductive materials. For example, the conductive portion 30 is formed by the use of polycrystalline silicon doped with impurities of a determined conduction type, silicide, or metal such as copper (Cu) or aluminum (Al). The insulating film 40 is an insulating film whose dielectric constant and moisture resistance are high compared with the insulating film 20. The insulating film 40 is, for example, a silicon oxide film or a silicon nitride film formed by a CVD (Chemical Vapor Deposition) method.

With the structure 1A the comparatively low dielectric constant insulating film 20 is formed between the substrate 10 and the conductive portion 30. As a result, the generation of parasitic capacitance between the substrate 10 and the conductive portion 30 is controlled compared with a case where a higher dielectric constant insulating film is used in place of the insulating film 20.

The low dielectric constant insulating film 20 has comparatively low film density and comparatively low moisture resistance. With the structure 1A, however, the insulating film 20 is covered with the high dielectric constant insulating film 40 which has higher film density and higher moisture resistance. By doing so, moisture absorption by the insulating film around the conductive portion 30 is controlled compared with a case where the conductive portion 30 is covered with a low dielectric constant insulating film.

By adopting the above structure 1A, the generation of parasitic capacitance is controlled. In addition, moisture absorption by the comparatively low dielectric constant insulating film 20 by which the generation of parasitic capacitance is controlled can be controlled by the insulating film 40 which has high moisture resistance.

Figure 2:
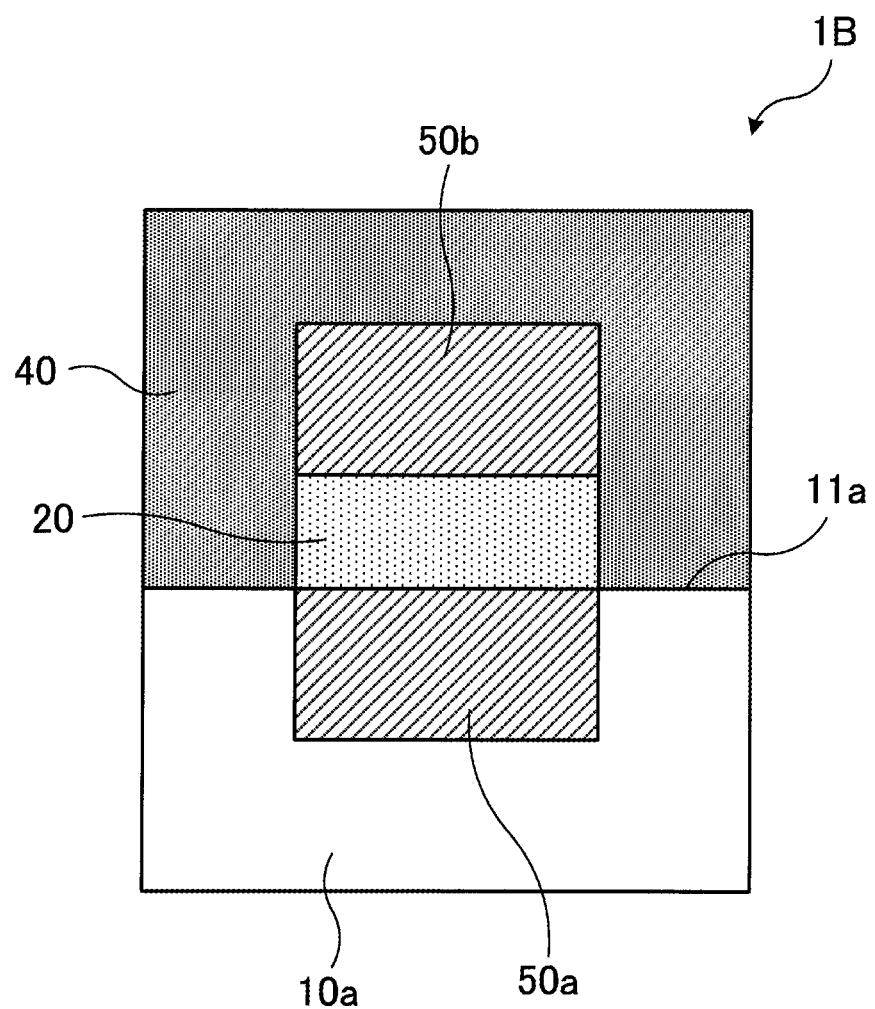
FIG. 2 is a fragmentary schematic sectional view of a second example of a semiconductor device.
Figure 3:
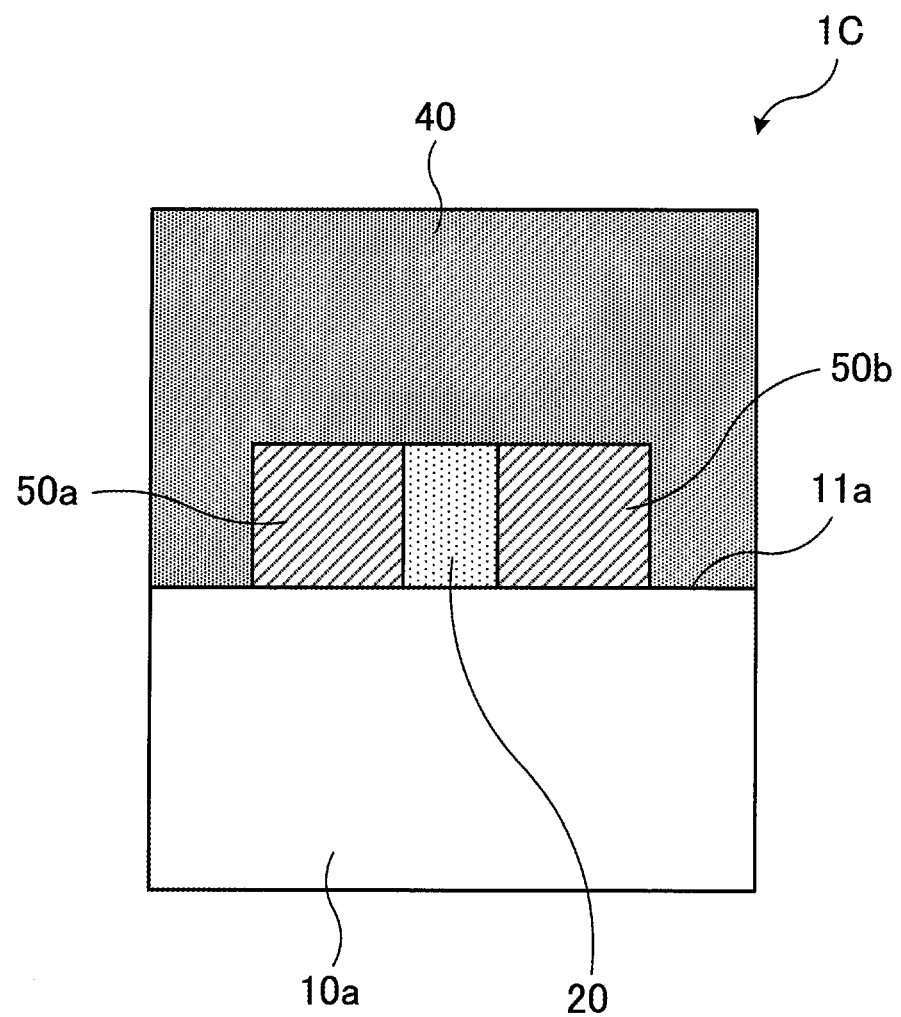
FIG. 3 is a fragmentary schematic sectional view of a third example of a semiconductor device.

FIG. 2 is a fragmentary schematic sectional view of a second example of a semiconductor device. FIG. 3 is a fragmentary schematic sectional view of a third example of a semiconductor device.

FIG. 2 illustrates as a second example a structure 1B in which an insulating film 20 is formed over a conductive portion 50a embedded in advance in a principal plane 11a of a substrate 10a and in which a conductive portion 50b is formed over the insulating film 20. The principal plane 11a, the insulating film 20, and the conductive portion 50b are covered with an insulating film 40 in the structure 1B.

The substrate 10a is, for example, an insulating film (interlayer insulating film). The conductive portion 50a is, for example, a wiring (lower-layer wiring) formed by the use of Cu, Al, or the like. Similarly, the conductive portion 50b is, for example, a wiring (upper-layer wiring) formed by the use of Cu, Al, or the like.

With the structure 1B the comparatively low dielectric constant insulating film 20 is formed between the conductive portions 50a and 50b which are, for example, lower- and upper-layer wirings respectively. Accordingly, the generation of parasitic capacitance between the conductive portions 50a and 50b is controlled compared with a case where a higher dielectric constant insulating film is used in place of the insulating film 20.

In addition, the low dielectric constant insulating film 20 is covered with the high dielectric constant insulating film 40 which has higher moisture resistance. By doing so, moisture absorption by the insulating film around the conductive portion 50b is controlled compared with a case where the conductive portion 50b is covered with a low dielectric constant insulating film.

By adopting the above structure 1B, the generation of parasitic capacitance is controlled. In addition, moisture absorption by the comparatively low dielectric constant insulating film 20 by which the generation of parasitic capacitance is controlled can be controlled by the insulating film 40 which has high moisture resistance.

Furthermore, FIG. 3 illustrates as a third example a structure 1C in which an insulating film 20 is formed over a principal plane 11a of a substrate 10a and in which conductive portions 50a and 50b are formed on both sides of the insulating film 20. The principal plane 11a, the insulating film 20, and the conductive portions 50a and 50b are covered with an insulating film 40 in the structure 1C. The conductive portions 50a and 50b are, for example, wirings formed in parallel over the substrate 10a such as an interlayer insulating film.

With the structure 1C the comparatively low dielectric constant insulating film 20 is formed between the conductive portions 50a and 50b which are, for example, wirings. Accordingly, the generation of parasitic capacitance between the conductive portions 50a and 50b is controlled compared with a case where a higher dielectric constant insulating film is used in place of the insulating film 20.

In addition, the low dielectric constant insulating film 20 is covered with the high dielectric constant insulating film 40 which has higher moisture resistance. By doing so, moisture absorption by the insulating film around the conductive portions 50a and 50b is controlled.

By adopting the above structure 1C, the generation of parasitic capacitance is controlled. In addition, moisture absorption by the comparatively low dielectric constant insulating film 20 by which the generation of parasitic capacitance is controlled can be controlled by the insulating film 40 which has high moisture resistance.

By applying the above structure 1A, 1B, or 1C to a semiconductor device, a high performance semiconductor device with high reliability is realized.

An example in which the above structure 1A, 1B, or 1C is applied to a semiconductor device will now be described.

A semiconductor device including a transistor with a T gate electrode is known. Description will now be given with a semiconductor device including an HEMI (High Electron Mobility Transistor) with a T gate electrode as an example.

Figure 4:
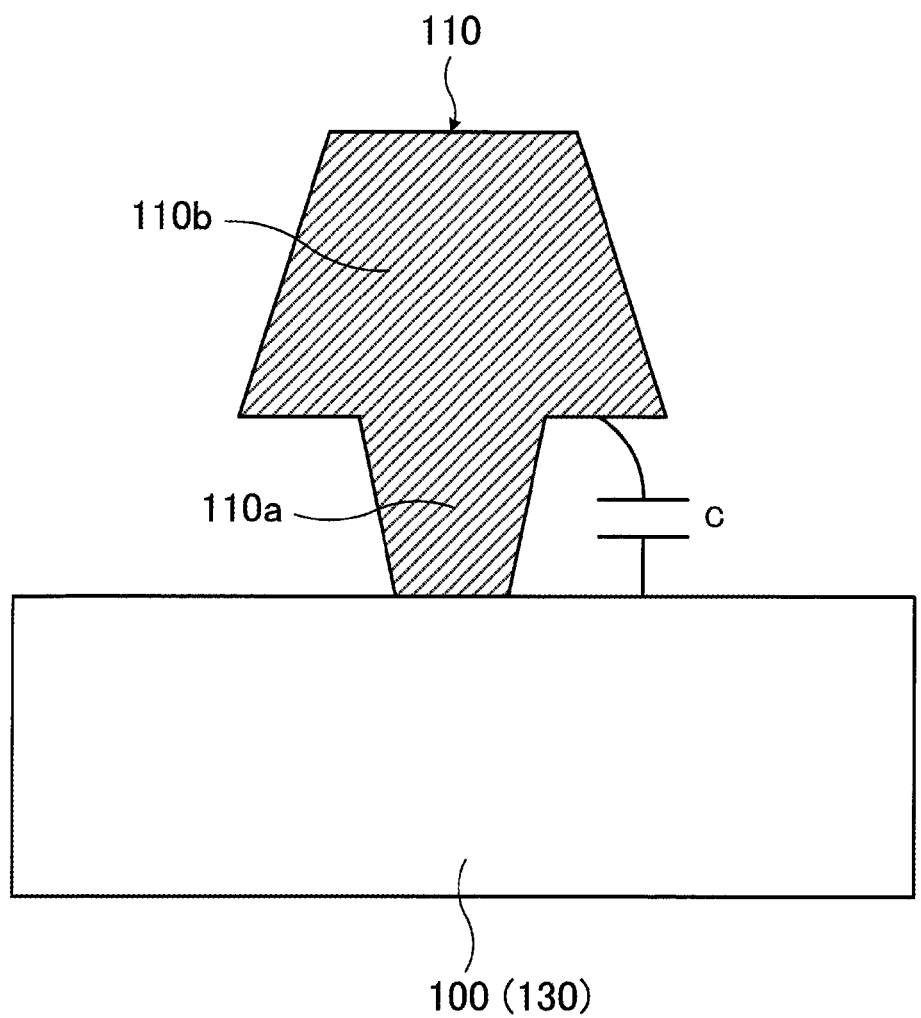
FIG. 4 illustrates an example of a T gate electrode.

FIG. 4 illustrates an example of a T gate electrode. FIG. 4 is a fragmentary schematic sectional view of an example of an HEMI with a T gate electrode.

In the example of FIG. 4, a gate electrode 110 a section of which has the shape of the letter "T" and which includes a narrow lower portion 110a and a wide upper portion 110b is formed over a compound semiconductor layer 100 of an HEMT made of gallium nitride (GaN) or the like. The formation of the T gate electrode 110 makes it possible to shorten gate length and reduce gate resistance. As a result, the high-frequency characteristics of the HEMI can be improved.

An HEMI is formed in the following way.

FIGS. 5 through 8 illustrate an example of an HEMI formation method. Each of FIGS. 5 through 8 is a fragmentary schematic sectional view of an HEMI formation process.

Figure 5:
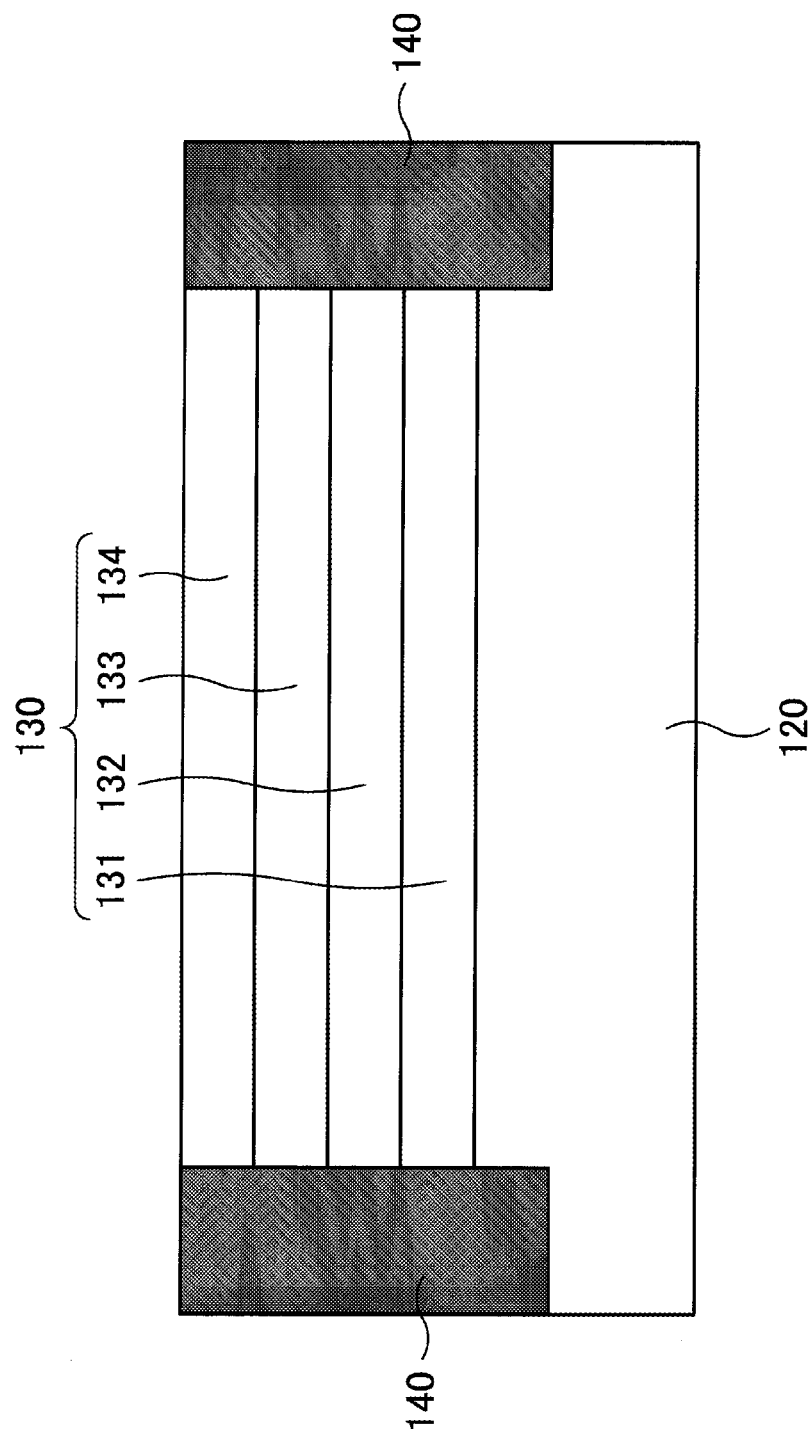
FIG. 5 illustrates an example of an HEMT formation method (part 1)

As illustrated in FIG. 5, first a compound semiconductor region 130 is formed over a semi-insulating silicon carbide (SiC) substrate 120 and isolation regions 140 are formed.

The compound semiconductor region 130 is formed by making an aluminum nitride (AlN) layer 131, a GaN layer 132, an aluminum gallium nitride (AlGaN) layer 133, and a GaN layer 134 epitaxial-grow in that order. The AlN layer 131 is a buffer layer, the GaN layer 132 is an electron transit layer, the AlGaN layer 133 is an electron supply layer, and the GaN layer 134 is a surface layer. Epitaxial growth is performed by an MOVPE (Metal Organic Vapor Phase Epitaxy) method.

After the compound semiconductor region 130 is formed, argon (Ar) is selectively implanted in the compound semiconductor region 130. By doing so, the isolation regions 140 for demarcating an active region are formed. The isolation regions 140 are formed so that they will pierce the compound semiconductor region 130 and so that they will reach the SiC substrate 120.

Figure 6:
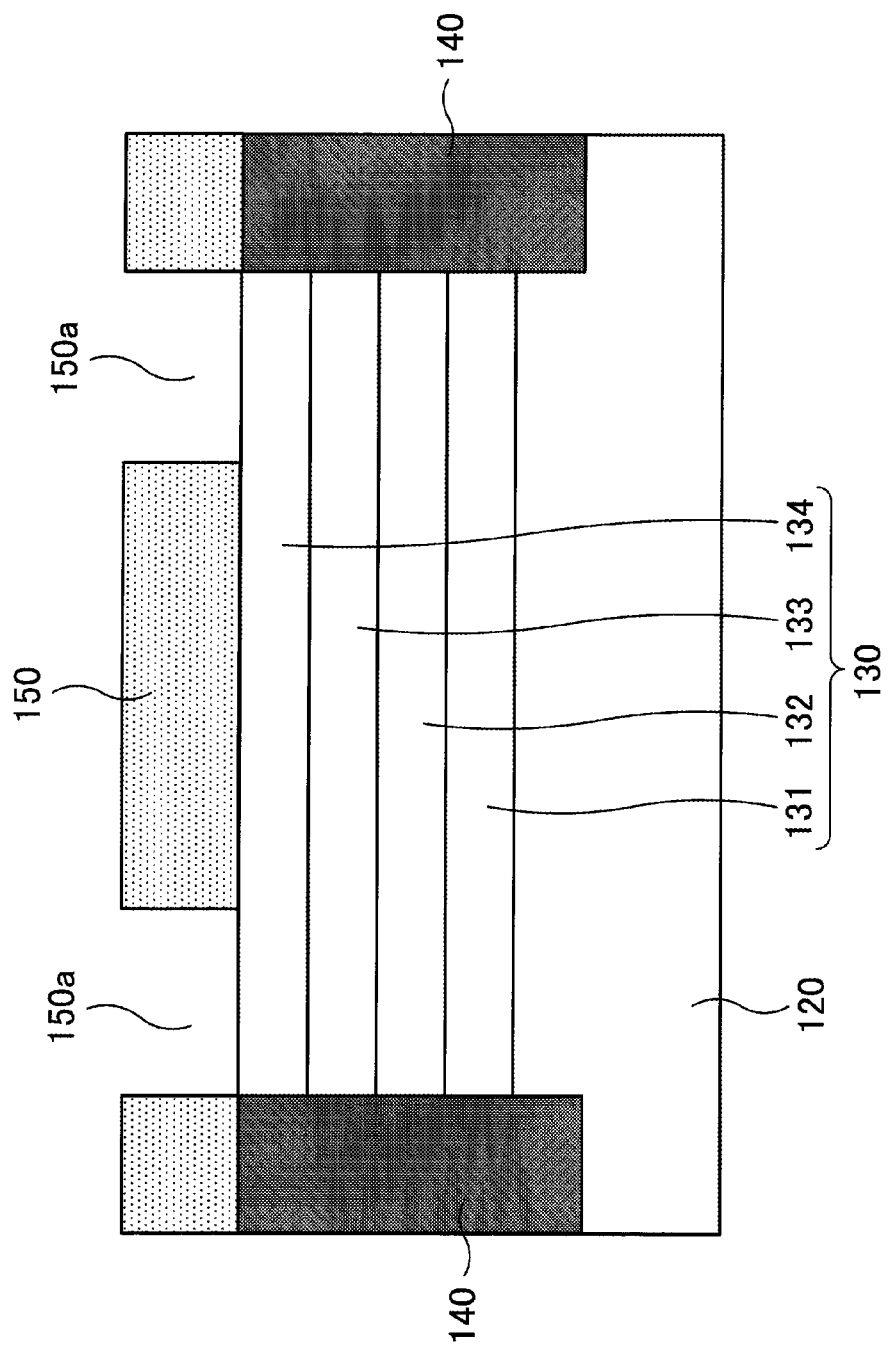
FIG. 6 illustrates an example of an HEMT formation method (part 2)
Figure 7:
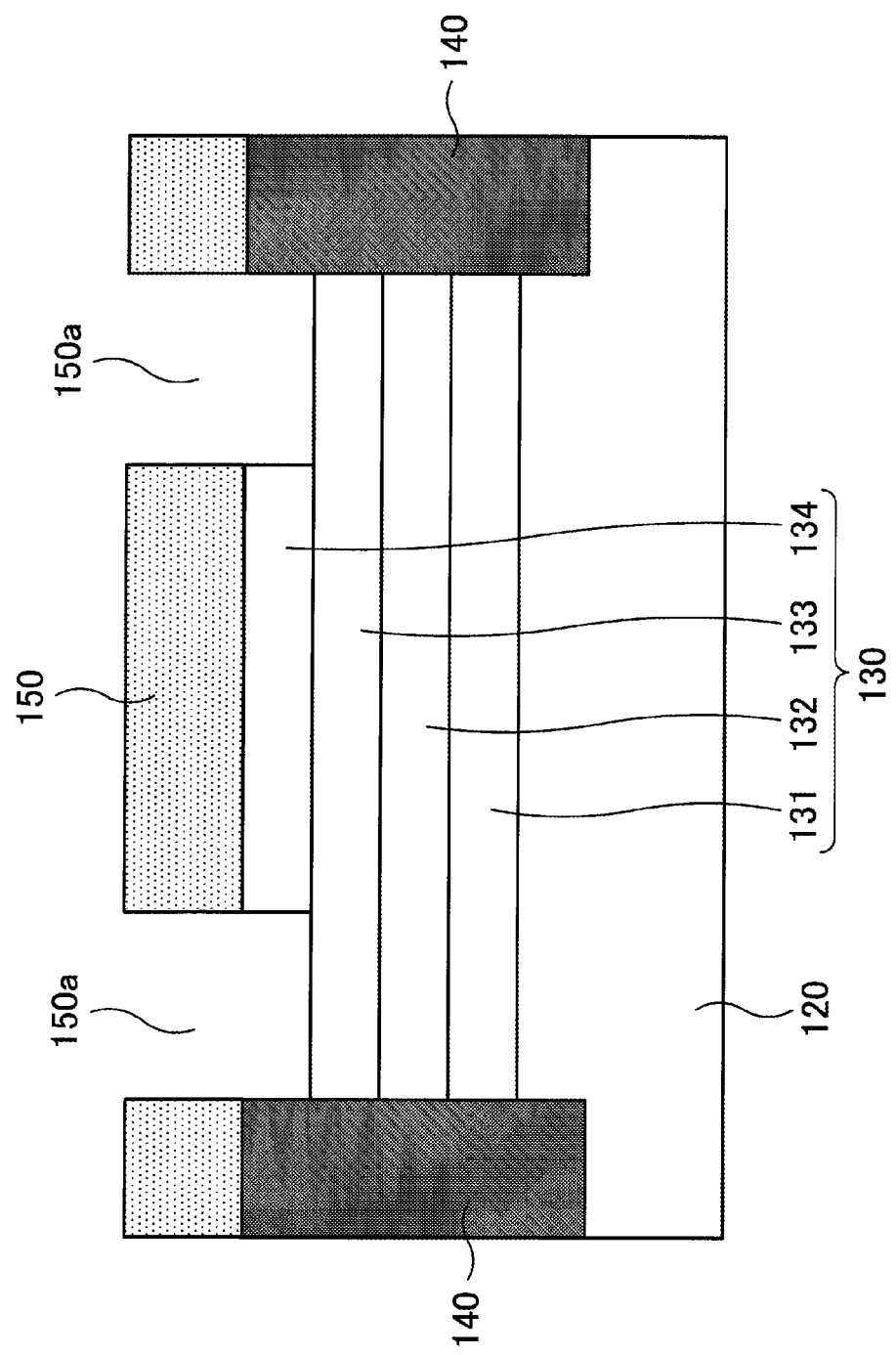
FIG. 7 illustrates an example of an HEMT formation method (part 3)

Next, as illustrated in FIG. 6, a resist 150 having opening portions 150a in regions where a source electrode and a drain electrode are to be formed is formed over the compound semiconductor region 130 and the isolation regions 140. As illustrated in FIG. 7, the GaN layer 134 which is exposed in the opening portions 150a is then etched with the resist 150 as a mask. FIG. 7 illustrates a state in which the GaN layer 134 is etched and in which the AlGaN layer 133 under the GaN layer 134 is exposed. However, a part of the GaN layer 134 may remain over the AlGaN layer 133 or a part of the AlGaN layer 133 may be etched.

Figure 8:
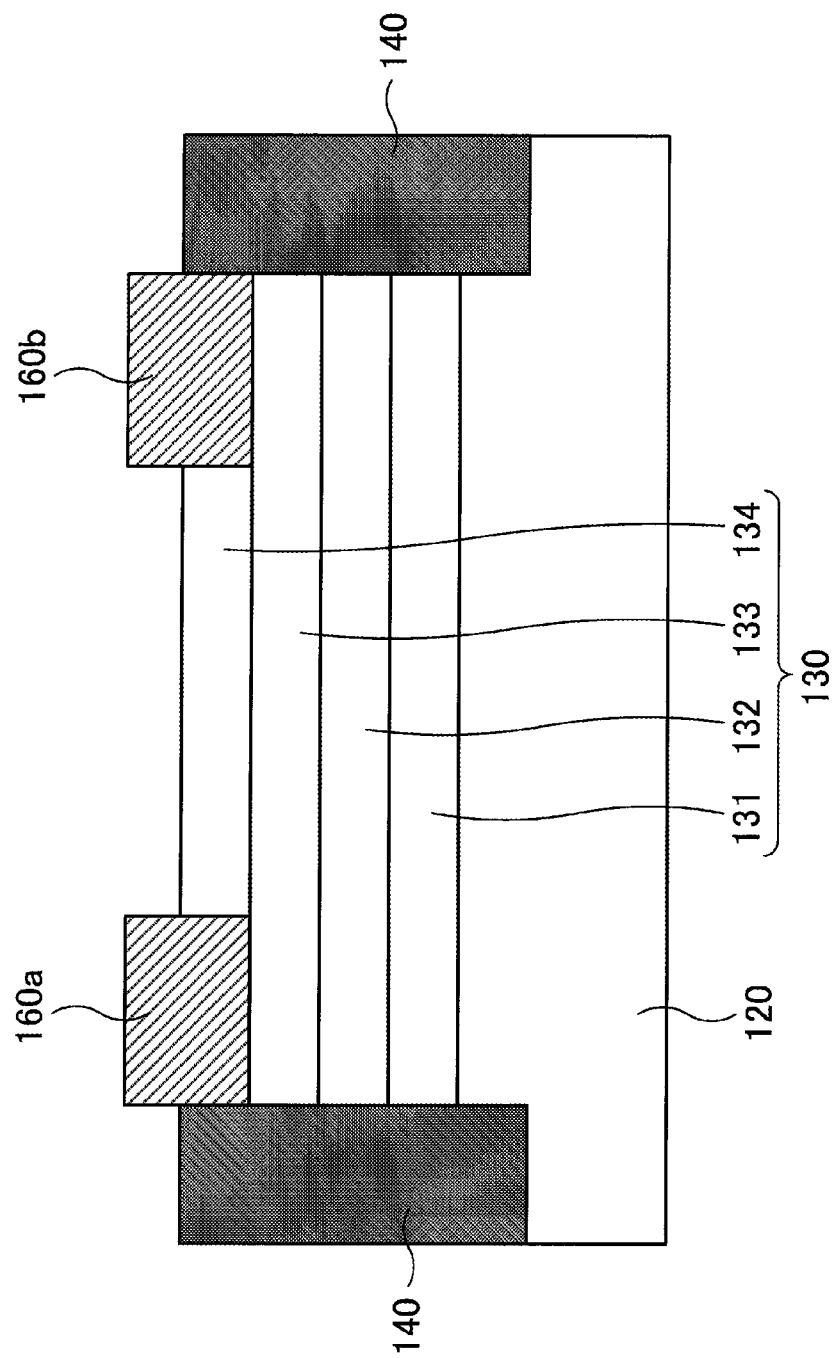
FIG. 8 illustrates an example of an HEMT formation method (part 4)

After the GaN layer 134 is etched, a source electrode 160a and a drain electrode 160b are formed in etched regions as illustrated in FIG. 8. At this time the source electrode 160a and the drain electrode 160b are formed, for example, in the following way. First a titanium (Ti) layer with determined thickness and an Al layer with determined thickness are formed in order by a deposition method. After that, the resist 150 is removed. The Ti layer and the Al layer formed over the resist 150 are removed, together with the resist 150 (lift off). After the resist 150 is removed, anneal is performed at determined temperature. By doing so, the source electrode 160a and the drain electrode 160b connected to the AlGaN layer 133 by ohmic contact are formed.

The T gate electrode 110 illustrated in FIG. 4, for example, is then formed over the GaN layer 134 between the source electrode 160a and the drain electrode 160b. As a result, an HEMT is formed.

By the way, the structure of the T gate electrode 110 illustrated in FIG. 4 may generate parasitic capacitance C between, for example, the wide upper portion 110b and the compound semiconductor layer 100 (compound semiconductor region 130). If the gate electrode 110 becomes minuter, the influence of the parasitic capacitance C on a high-frequency high-power HEMT cannot be ignored. That is to say, the parasitic capacitance C may impede the improvement of high-frequency characteristics of an HEMT.

The T gate electrode 110 which is connected only by the lower portion 110a to the compound semiconductor layer 100 is unstable and may fall. In addition, the gate electrode 110 is finally covered with an insulating film of some kind from the viewpoint of protection of the gate electrode 110. If a comparatively high dielectric constant insulating film is used as an insulating film which covers the gate electrode 110, then comparatively high parasitic capacitance C may be generated between the upper portion 110b and the compound semiconductor layer 100. By using a comparatively low dielectric constant insulating film as an insulating film which covers the gate electrode 110, the parasitic capacitance C between the upper portion 110b and the compound semiconductor layer 100 can be controlled.

An example of a method for forming a T gate electrode covered with an insulating film will now be described.

Figure 9:
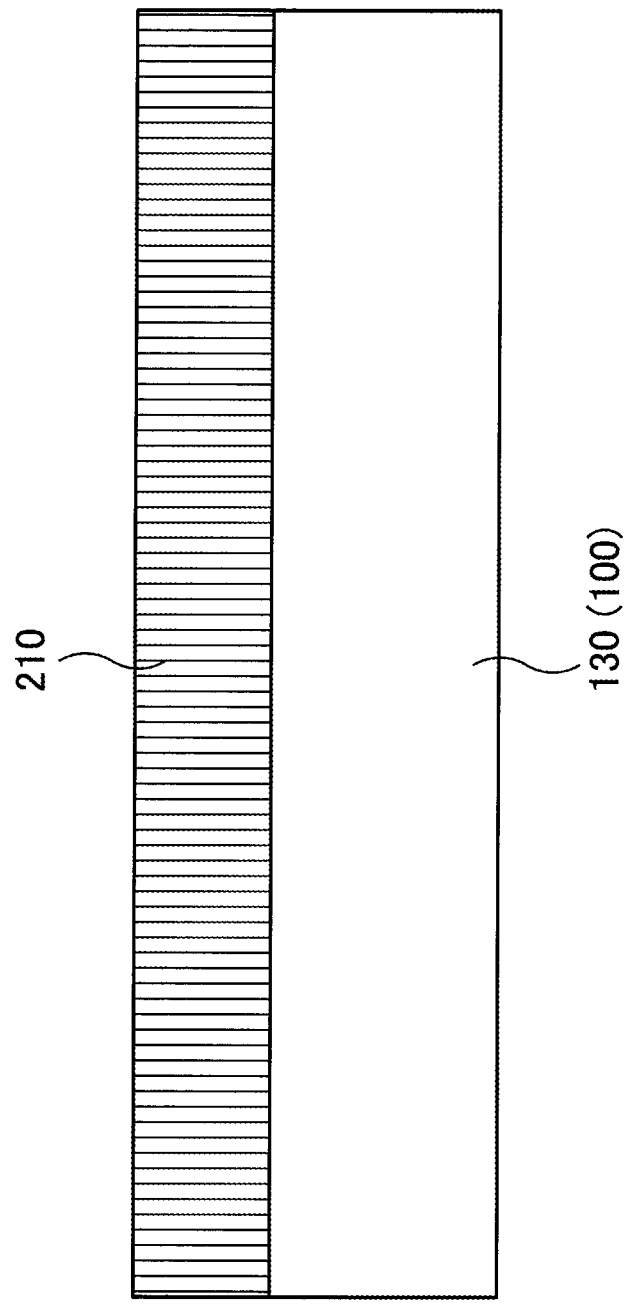
FIG. 9 illustrates a first example of a gate electrode formation method (part 1)
Figure 10:
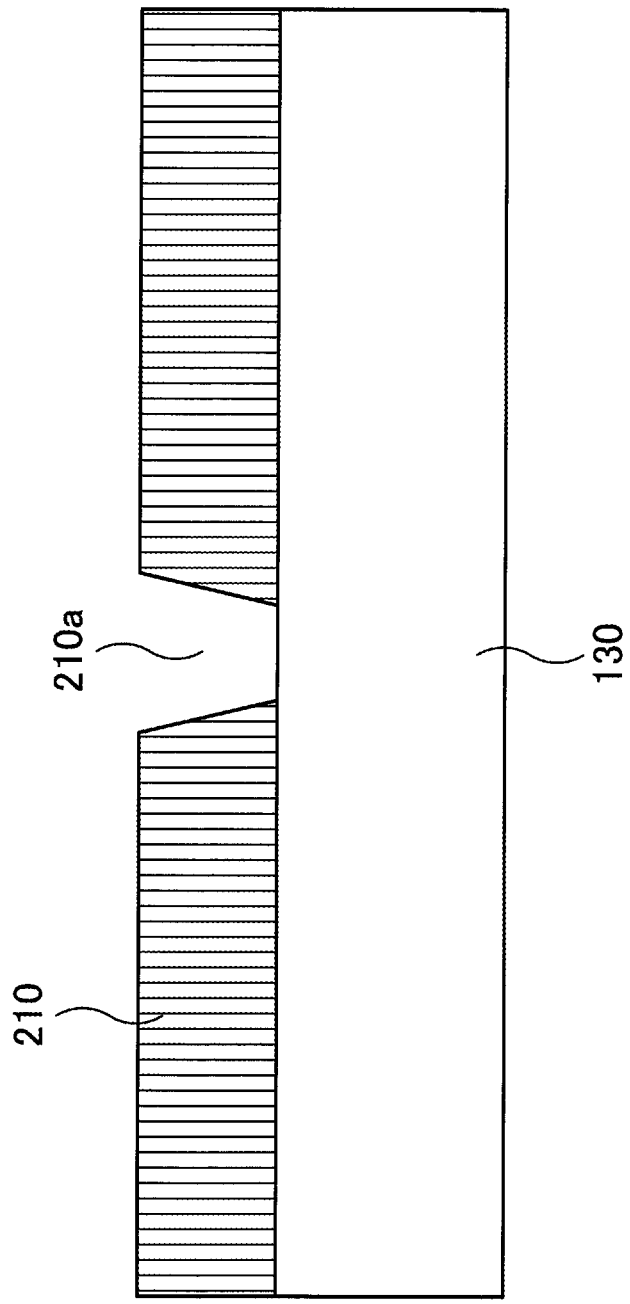
FIG. 10 illustrates a first example of a gate electrode formation method (part 2)
Figure 11:
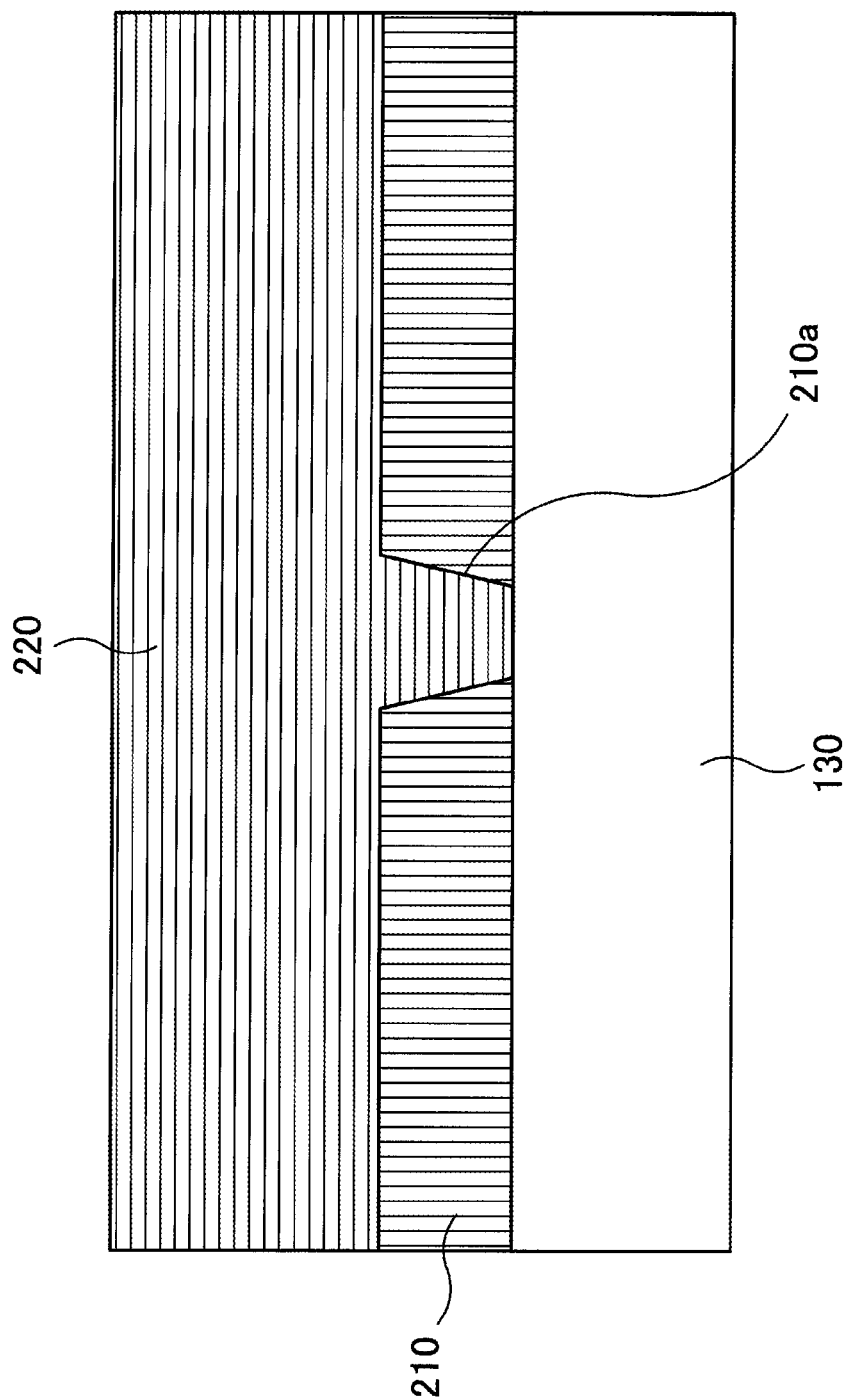
FIG. 11 illustrates a first example of a gate electrode formation method (part 3)
Figure 12:
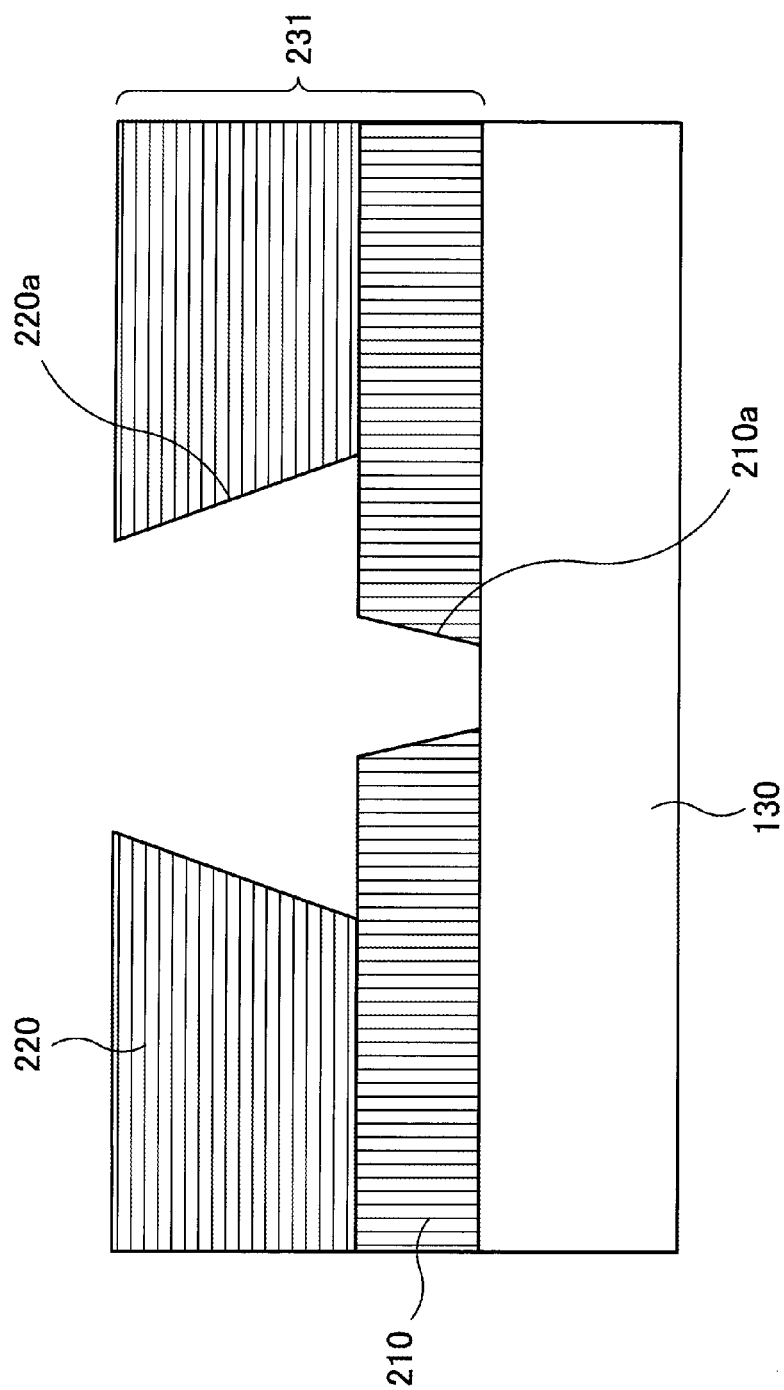
FIG. 12 illustrates a first example of a gate electrode formation method (part 4)
Figure 14:
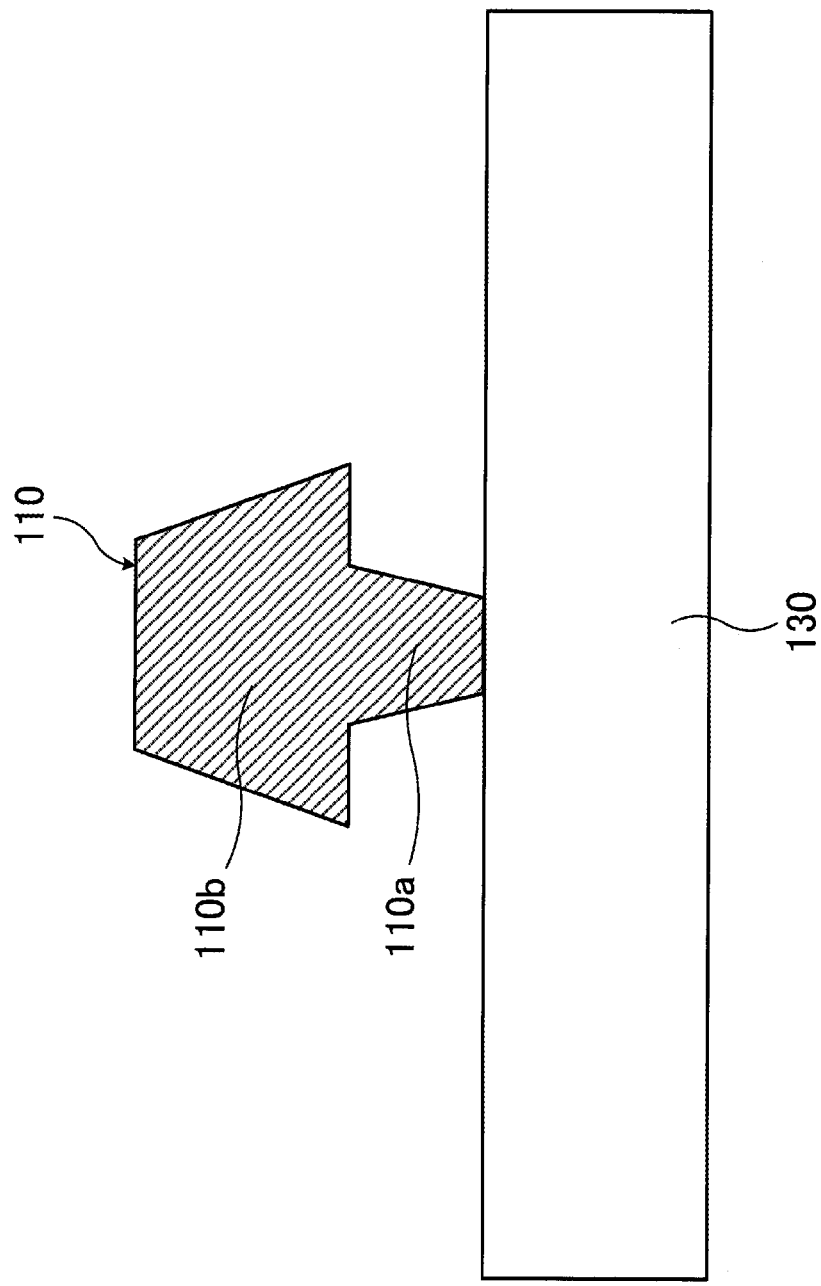
FIG. 14 illustrates a first example of a gate electrode formation method (part 6)
Figure 15:
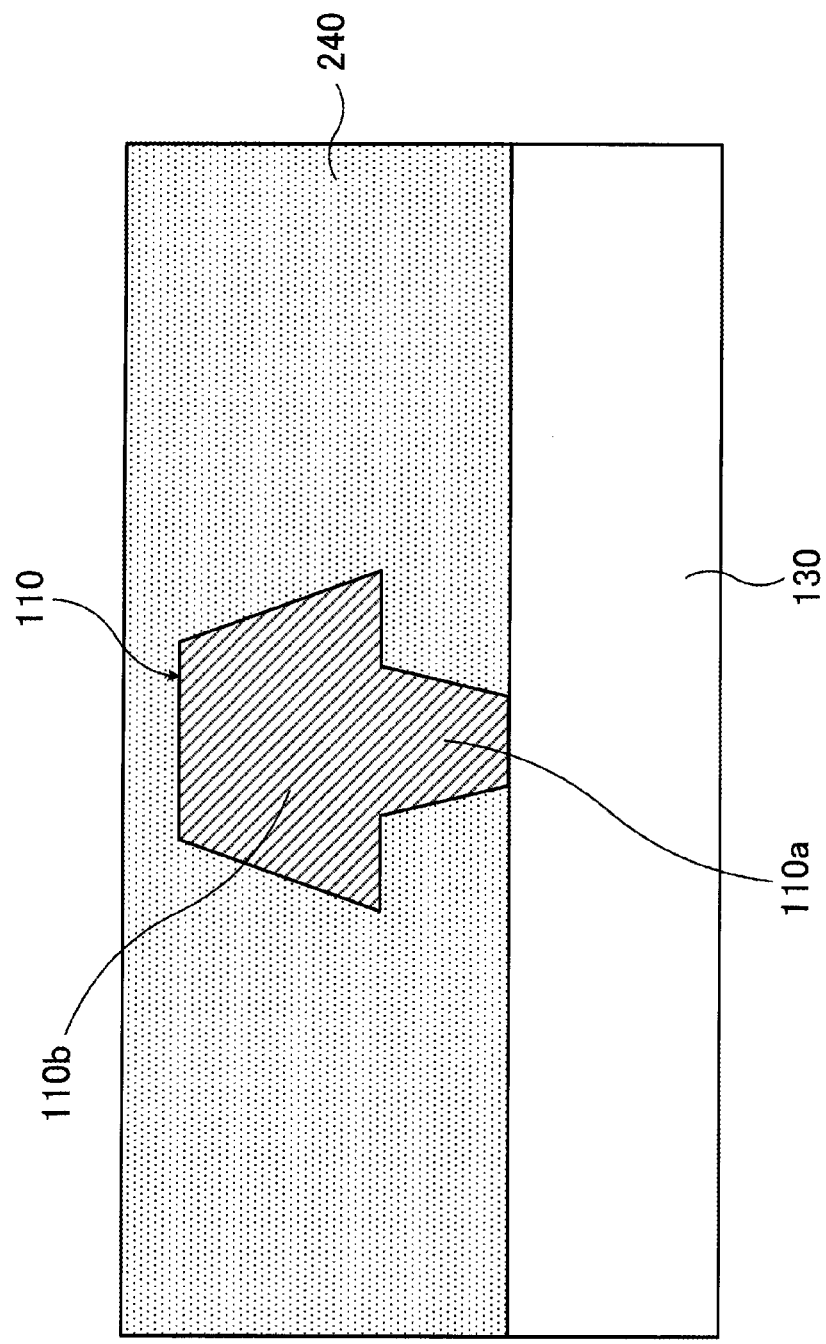
FIG. 15 illustrates a first example of a gate electrode formation method (part 7)

A first example of a gate electrode formation method will be described with reference to FIGS. 9 through 15. FIG. 9 is a fragmentary schematic sectional view of a first resist formation process. FIG. 10 is a fragmentary schematic sectional view of a first exposure and development process. FIG. 11 is a fragmentary schematic sectional view of a second resist formation process. FIG. 12 is a fragmentary schematic sectional view of a second exposure and development process. FIG. is a fragmentary schematic sectional view of an electrode material deposition process. FIG. 14 is a fragmentary schematic sectional view of a resist removal process. FIG. 15 is a fragmentary schematic sectional view of an insulating film formation process.

As illustrated in FIG. 9, first a photosensitive resist 210 is formed by a spin coating method over the compound semiconductor region 130 (compound semiconductor layer 100) which has passed through the above processes illustrated in FIGS. 5 through 8. As illustrated in FIG. 10, exposure and development are then performed on the resist 210 to form an opening portion 210a in a region in which the lower portion 110a of the T gate electrode 110 is to be formed. As illustrated in FIG. 11, a resist 220 which differs from the resist 210 in photosensitivity is then formed over the compound semiconductor region 130 and the resist 210 by the spin coating method. Each of the resists 210 and 220 is insoluble in the other. As illustrated in FIG. 12, exposure and development are then performed on the resist 220 to form an opening portion 220a in a region in which the upper portion 110b of the T gate electrode 110 is to be formed. As a result, a mask pattern 231 (resists 210 and 220) for gate electrode formation is formed.

Figure 13:
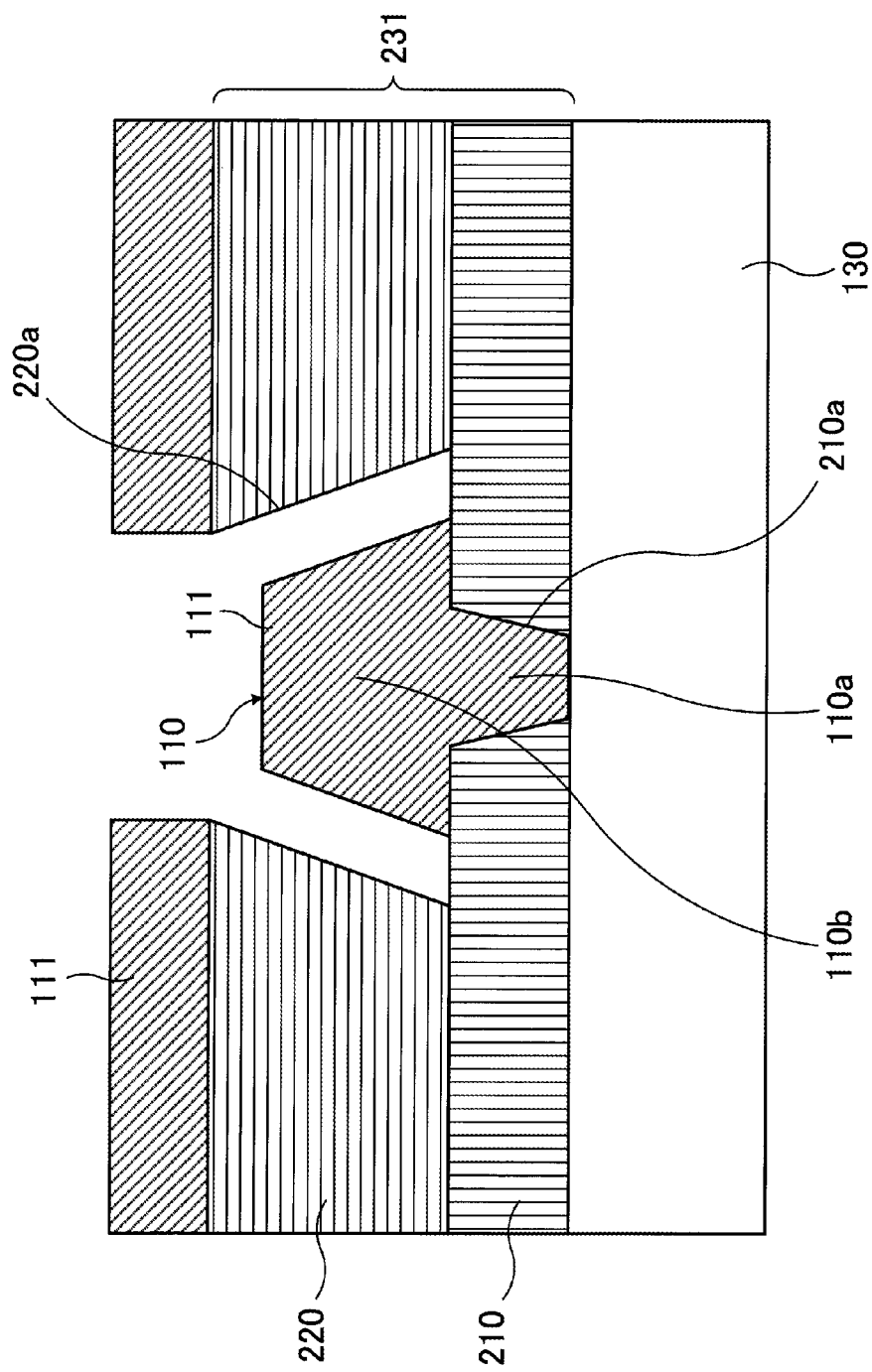
FIG. 13 illustrates a first example of a gate electrode formation method (part 5)

After the formation of the mask pattern 231, as illustrated in FIG. 13, an electrode material 111 is deposited over the compound semiconductor region 130 and the mask pattern 231 by a sputtering method. The electrode material 111 which ingresses into an opening (opening portions 210a and 220a) in the mask pattern 231 is deposited in the opening portion 210a in the resist 210 and in the opening portion 220a in the resist 220 on the resist 210. As a result, the T gate electrode 110 is formed. That is to say, a portion deposited in the opening portion 210a in the resist 210 corresponds to the lower portion 110a of the T gate electrode 110 and a portion deposited in the opening portion 220a in the resist 220 on the resist 210 corresponds to the upper portion 110b of the T gate electrode 110. The electrode material 111 is also deposited over the mask pattern 231.

After the deposition of the electrode material 111, as illustrated in FIG. 14, the resists 210 and 220 and an unnecessary electrode material 111 (deposited over the resist 220) are removed by lift-off by the use of a solvent. The T gate electrode 110 after the lift-off is in a state in which it is connected to the compound semiconductor region 130 by the lower portion 110a. Accordingly, as the width of the opening portion 210a of the resist 210 is made smaller in the above process illustrated in FIG. 10, that is to say, as the width of the lower portion 110a is made smaller, the possibility that the T gate electrode 110 falls at the time of or after the lift-off increases.

As illustrated in FIG. 15, the T gate electrode 110 which is formed in a state in which it stands over the compound semiconductor region 130 is covered with a comparatively low dielectric constant insulating film 240 which is referred to as a low-k film. For example, a resin material (such as siloxane-based resin) with which a template (such as a heat-decomposable organic resin) is mixed in advance is applied over the compound semiconductor region 130. The resin material is polymerized and the template is decomposed and removed by heating. By doing so, a porous insulating film 240 is formed.

With the method in the first example the whole of the T gate electrode 110 formed over the compound semiconductor region 130 is covered with the insulating film 240. This prevents the T gate electrode 110 from falling, and controls parasitic capacitance between the upper portion 110b and the compound semiconductor region 130.

However, the comparatively low dielectric constant insulating film 240 has pores and has comparatively low film density. As a result, its moisture resistance and mechanical strength are low. Therefore, moisture absorption or the appearance of a crack may deteriorate the reliability of an HEMI. In addition, heat treatment at a comparatively high temperature of 300 to 400° C. at the time of the formation of the insulating film 240 may cause damage to a Schottky junction between the T gate electrode 110 and the compound semiconductor region 130.

Figure 16:
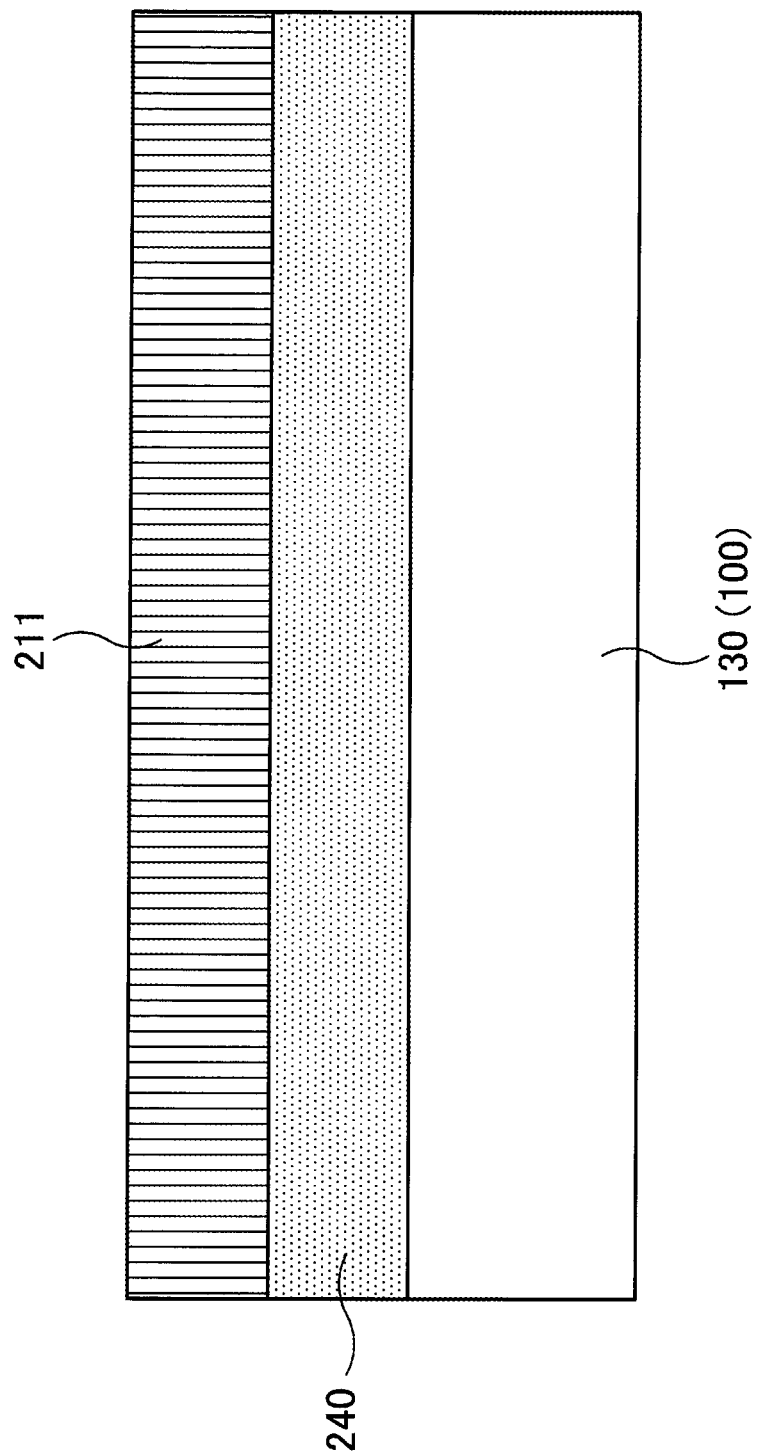
FIG. 16 is a second example of a gate electrode formation method (part 1)
Figure 17:
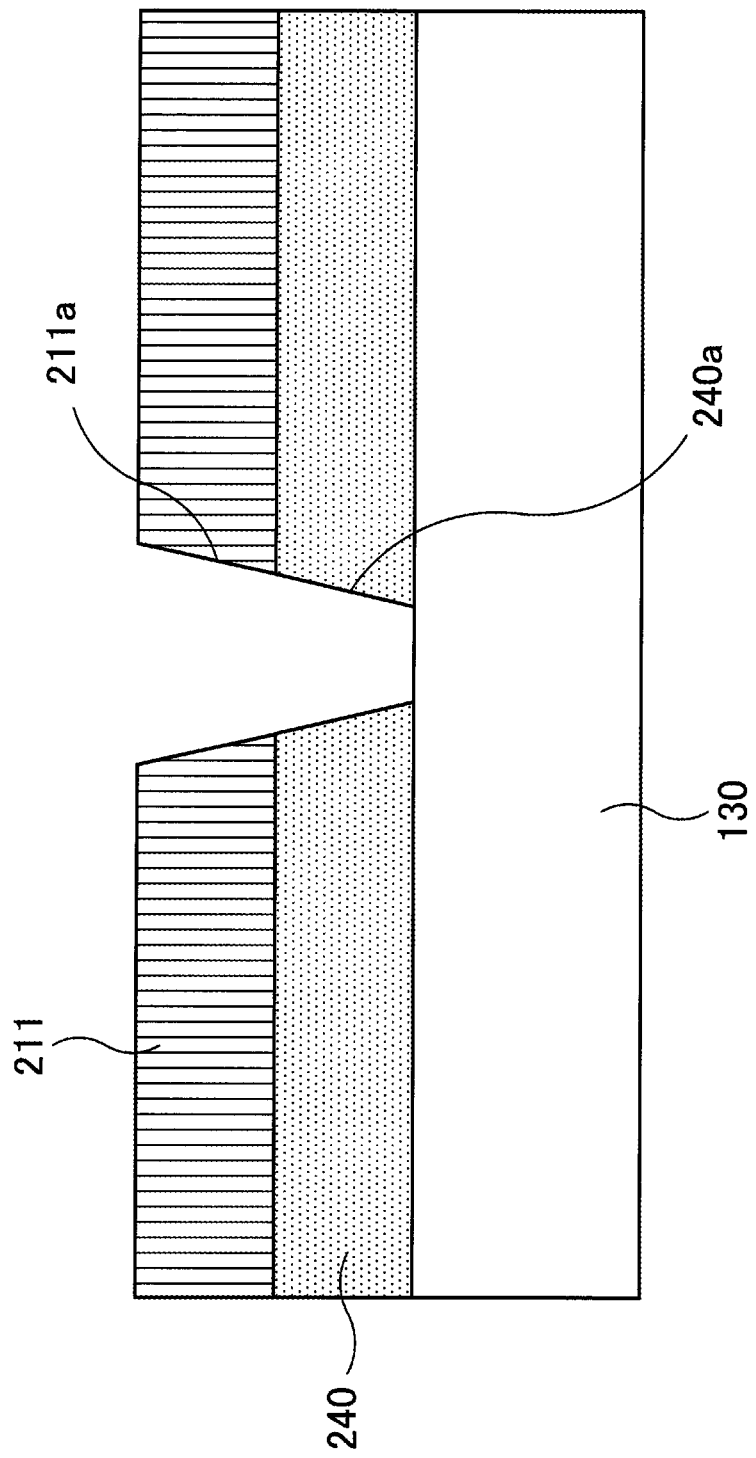
FIG. 17 is a second example of a gate electrode formation method (part 2)
Figure 18:
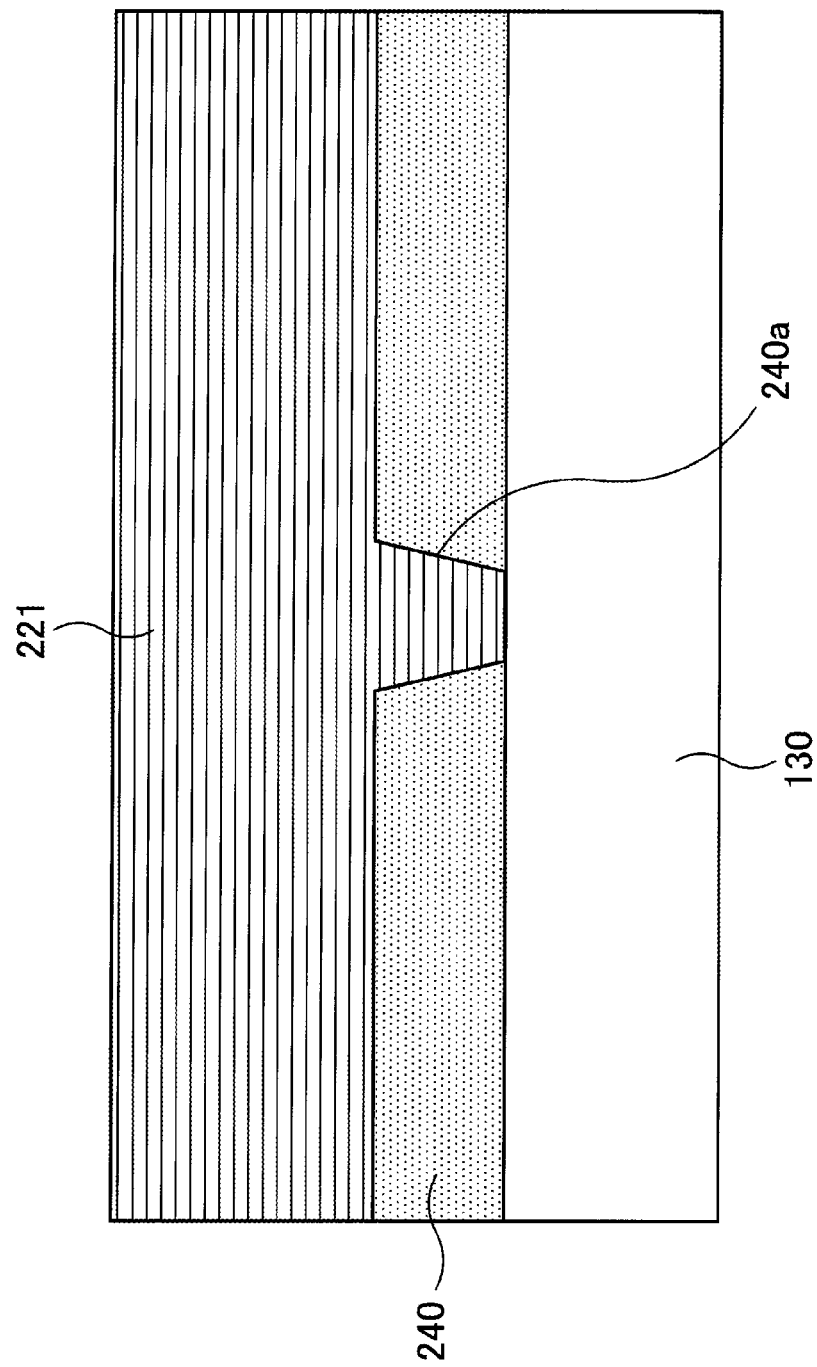
FIG. 18 is a second example of a gate electrode formation method (part 3)
Figure 19:
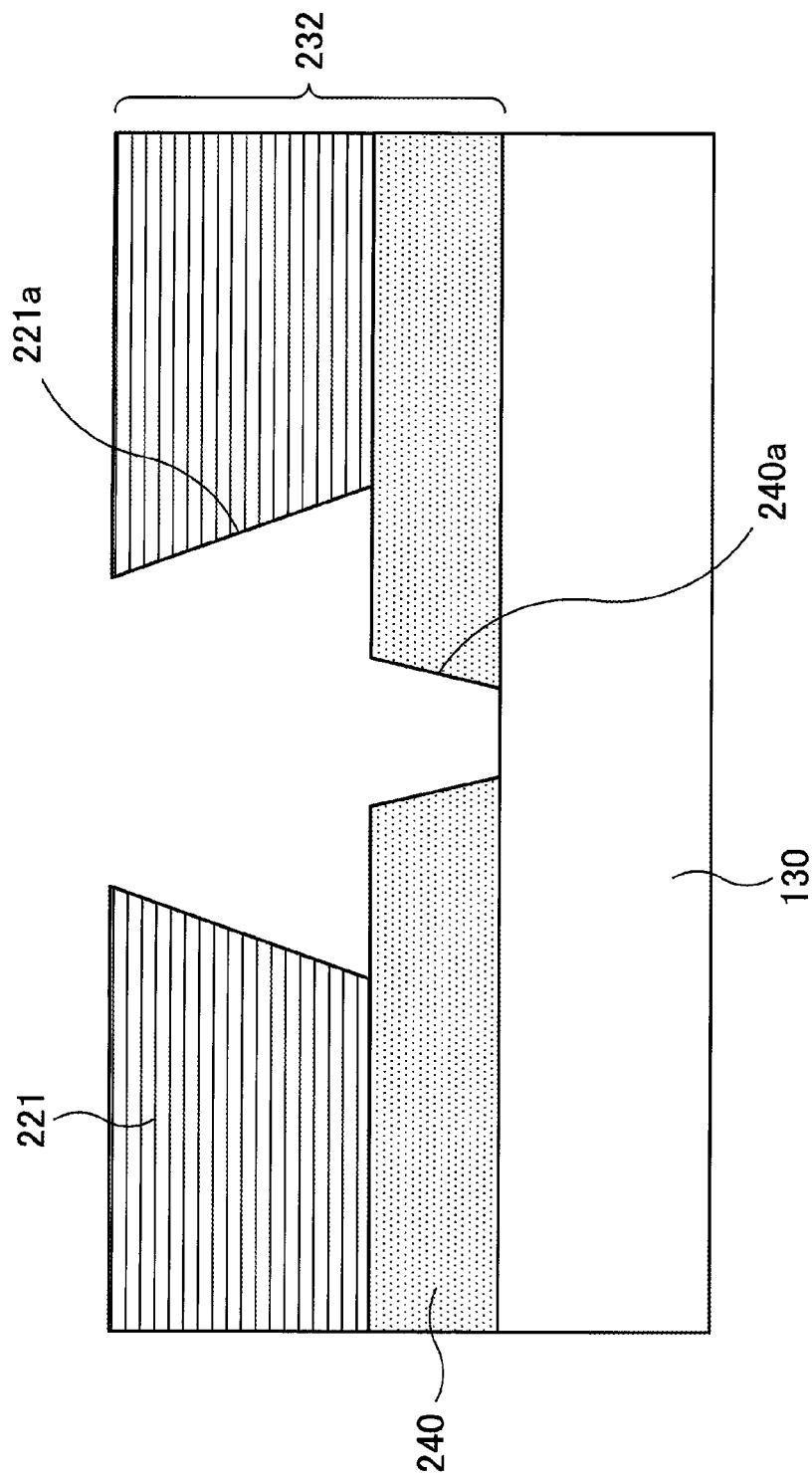
FIG. 19 is a second example of a gate electrode formation method (part 4)
Figure 20:
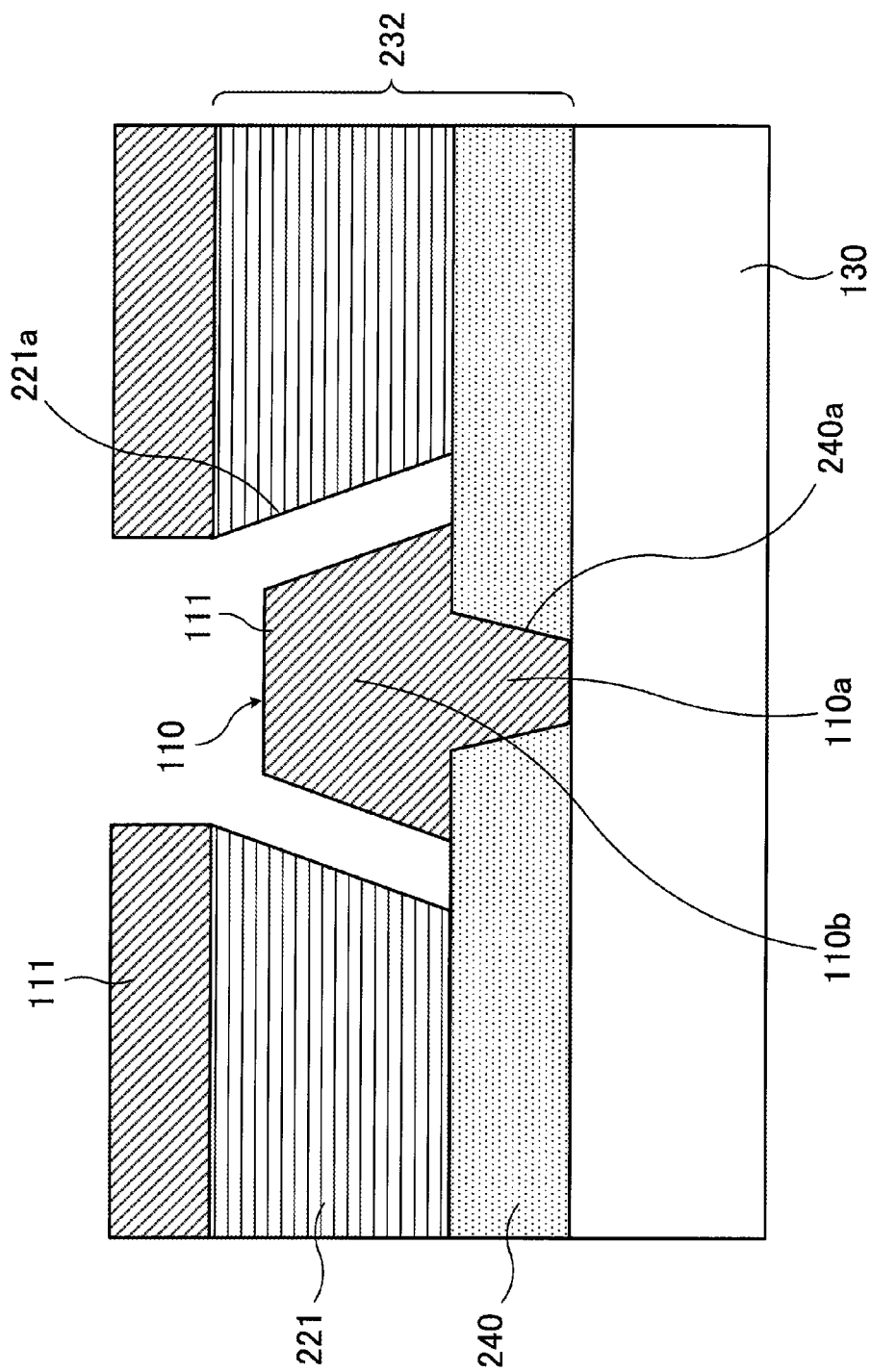
FIG. 20 is a second example of a gate electrode formation method (part 5)
Figure 21:
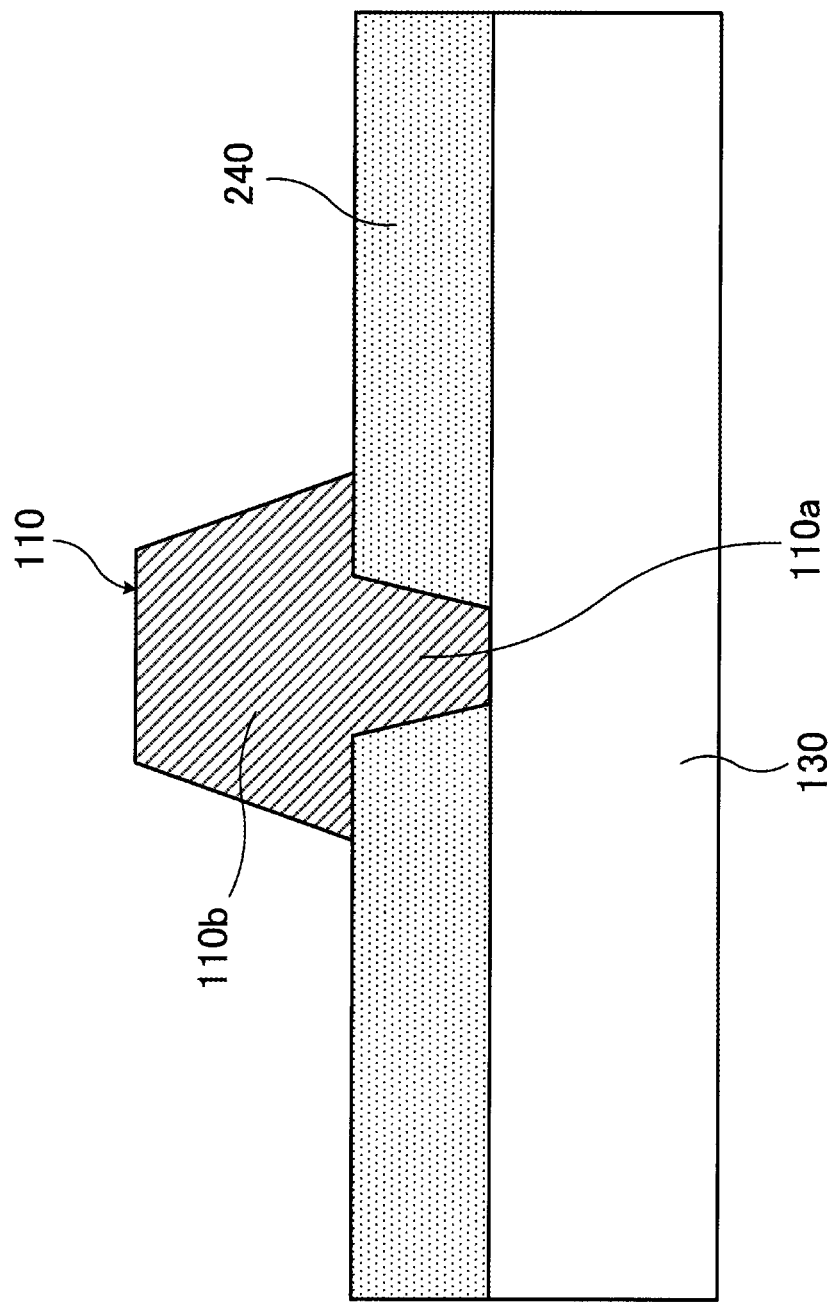
FIG. 21 is a second example of a gate electrode formation method (part 6)
Figure 22:
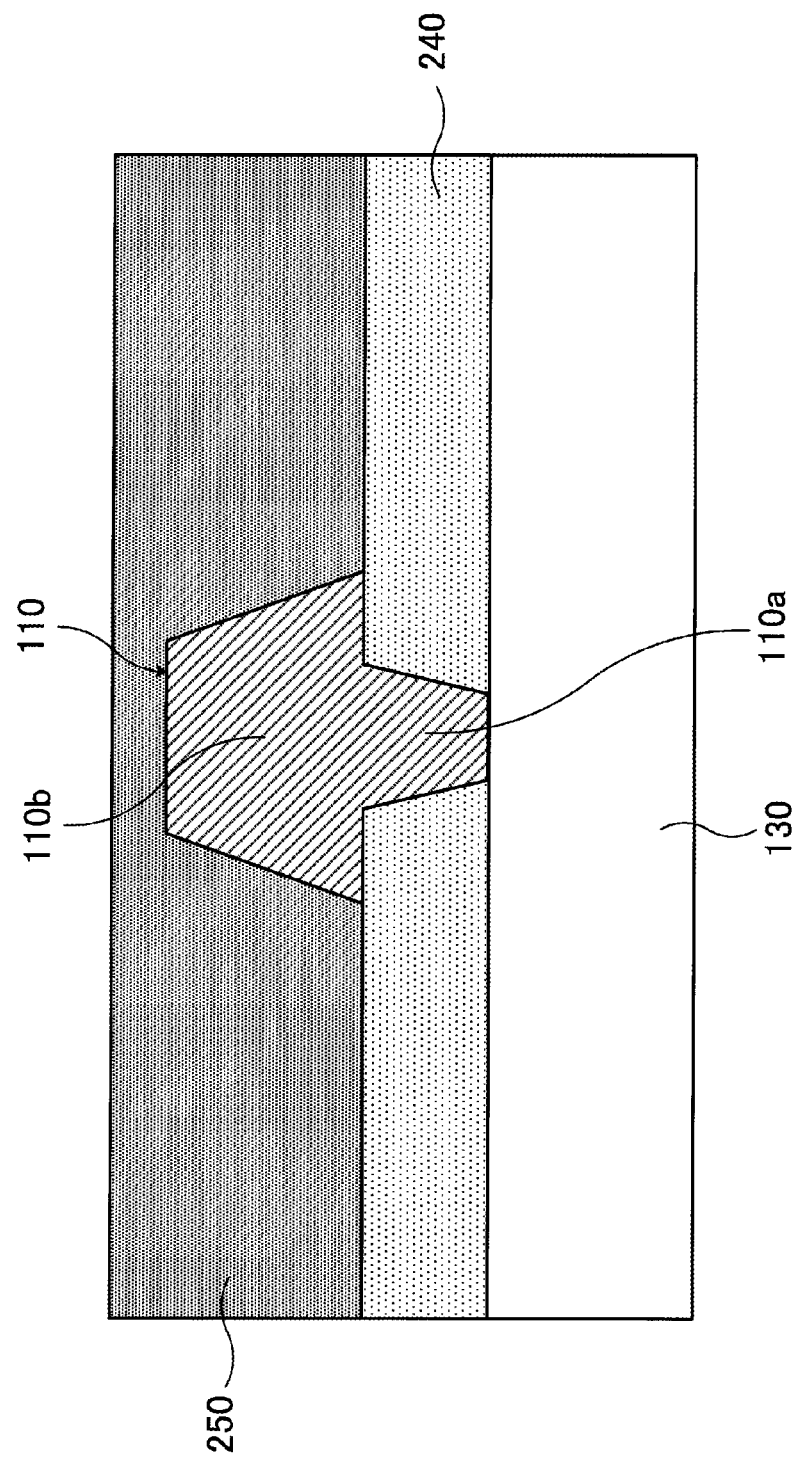
FIG. 22 is a second example of a gate electrode formation method (part 7)

Next, a second example of a gate electrode formation method will be described with reference to FIGS. 16 through 22. FIG. 16 is a fragmentary schematic sectional view of an insulating film and resist formation process. FIG. 17 is a fragmentary schematic sectional view of an exposure, development, and etching process. FIG. 18 is a fragmentary schematic sectional view of a resist formation process. FIG. 19 is a fragmentary schematic sectional view of an exposure and development process. FIG. 20 is a fragmentary schematic sectional view of an electrode material deposition process. FIG. 21 is a fragmentary schematic sectional view of a resist removal process. FIG. 22 is a fragmentary schematic sectional view of an insulating film formation process.

As illustrated in FIG. 16, first a comparatively low dielectric constant insulating film 240 which is a low-k film is formed over the compound semiconductor region 130 (compound semiconductor layer 100) which has passed through the above processes illustrated in FIGS. 5 through 8. A resist 211 is formed over the insulating film 240. The insulating film 240 in the second example is formed in the same way that is used for forming the insulating film 240 described in FIG. 15 of the above first example. The resist 211 is formed by the spin coating method over the insulating film 240 formed in that way over the compound semiconductor region 130.

However, heat treatment at a comparatively high temperature at the time of the formation of the insulating film 240 may cause damage to a surface of the compound semiconductor region 130 which is a Schottky junction between the T gate electrode 110 and the compound semiconductor region 130. This is the same with the above first example.

After the formation of the insulating film 240 and the resist 211, as illustrated in FIG. 17, exposure and development are performed on the resist 211 to form an opening portion 211a in a region in which the lower portion 110a of the T gate electrode 110 is to be formed. Dry etching is then performed with the resist 211 in which the opening portion 211a is formed as a mask to transfer a pattern of the resist 211 onto the insulating film 240. As a result, an opening portion 240a in which the lower portion 110a of the T gate electrode 110 is to be formed is formed in the insulating film 240.

However, the dry etching of the insulating film 240 may cause etching damage to the foundation compound semiconductor region 130 and cause damage to the surface of the compound semiconductor region 130 which is a Schottky junction between the T gate electrode 110 and the compound semiconductor region 130. Furthermore, when the insulating film 240 is dry-etched, the size of the opening portion 240a may increase or vary. This makes it impossible to form a desired opening portion 240a.

After the insulating film 240 is dry-etched, the resist 211 is removed. As illustrated in FIG. 18, a resist 221 is then formed by the spin coating method over the compound semiconductor region 130 and the insulating film 240. After that, as illustrated in FIG. 19, exposure and development are performed on the resist 221 to form an opening portion 221a in a region in which the upper portion 110b of the T gate electrode 110 is to be formed. As a result, a mask pattern 232 (including the insulating film 240 and the resist 221) for gate electrode formation is formed.

After the formation of the mask pattern 232, as illustrated in FIG. 20, an electrode material 111 is deposited over the compound semiconductor region 130 and the mask pattern 232 by the sputtering method. The electrode material 111 which ingresses into an opening (opening portions 240a and 221a) in the mask pattern 232 is deposited in the opening portion 240a in the insulating film 240 and in the opening portion 221a in the resist 221 on the insulating film 240. As a result, the T gate electrode 110 is formed. That is to say, a portion deposited in the opening portion 240a in the insulating film 240 corresponds to the lower portion 110a of the T gate electrode 110 and a portion deposited in the opening portion 221a in the resist 221 on the insulating film 240 corresponds to the upper portion 110b of the T gate electrode 110. The electrode material 111 is also deposited over the mask pattern 232.

After the deposition of the electrode material 111, as illustrated in FIG. 21, the resist 221 and an unnecessary electrode material 111 (deposited over the resist 221) are removed by lift-off by the use of a solvent. The lower portion 110a and the upper portion 110b of the T gate electrode 110 after the lift-off are supported by the insulating film 240. This prevents the T gate electrode 110 from falling.

As illustrated in FIG. 22, the T gate electrode 110 is covered with a comparatively high dielectric constant insulating film 250 whose film density and moisture resistance are higher than those of the insulating film 240. For example, the CVD method is used for forming the insulating film 250 by depositing silicon oxide or the like.

With the method in the second example the comparatively low dielectric constant insulating film 240 is formed between the upper portion 110b of the T gate electrode 110 and the compound semiconductor region 130, so parasitic capacitance between them is controlled. However, if the comparatively low dielectric constant insulating film 240 extends to a side of an HEMT and an edge of the insulating film 240 is exposed to the outside, the edge of the insulating film 240 absorbs moisture. Therefore, even if a top of the HEMI is covered with the insulating film 250 whose moisture resistance is higher, the reliability of the HEMI may deteriorate.

In consideration of the methods in the first and second examples, the following method will now be used for realizing a structure in which a T gate electrode included in an HEMI is covered with an insulating film.

Figure 23:
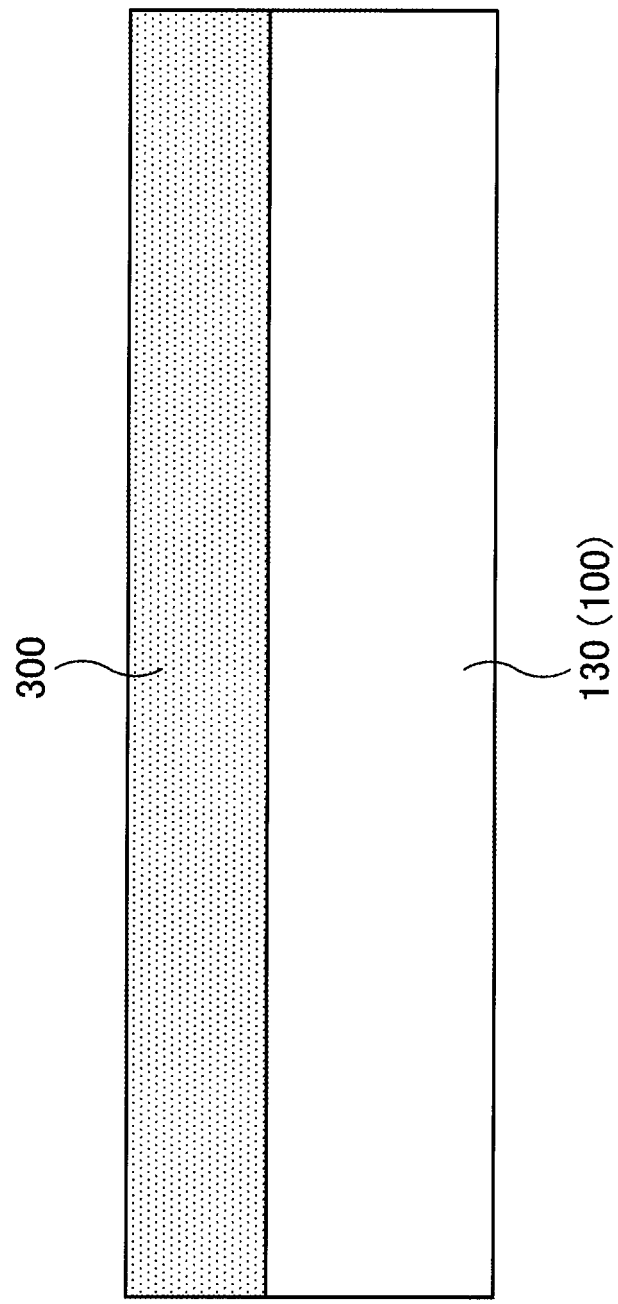
FIG. 23 illustrates a gate electrode formation method according to an embodiment (part 1)
Figure 24:
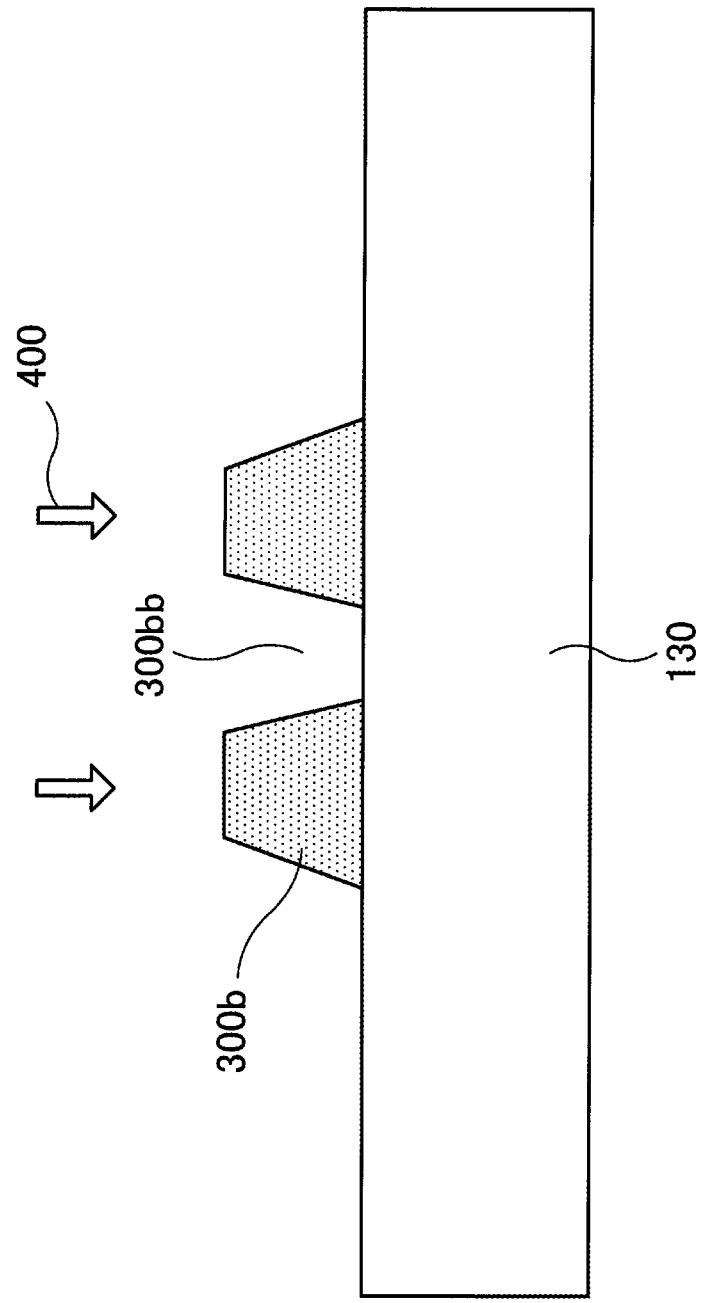
FIG. 24 illustrates a gate electrode formation method according to an embodiment (part 2)
Figure 25:
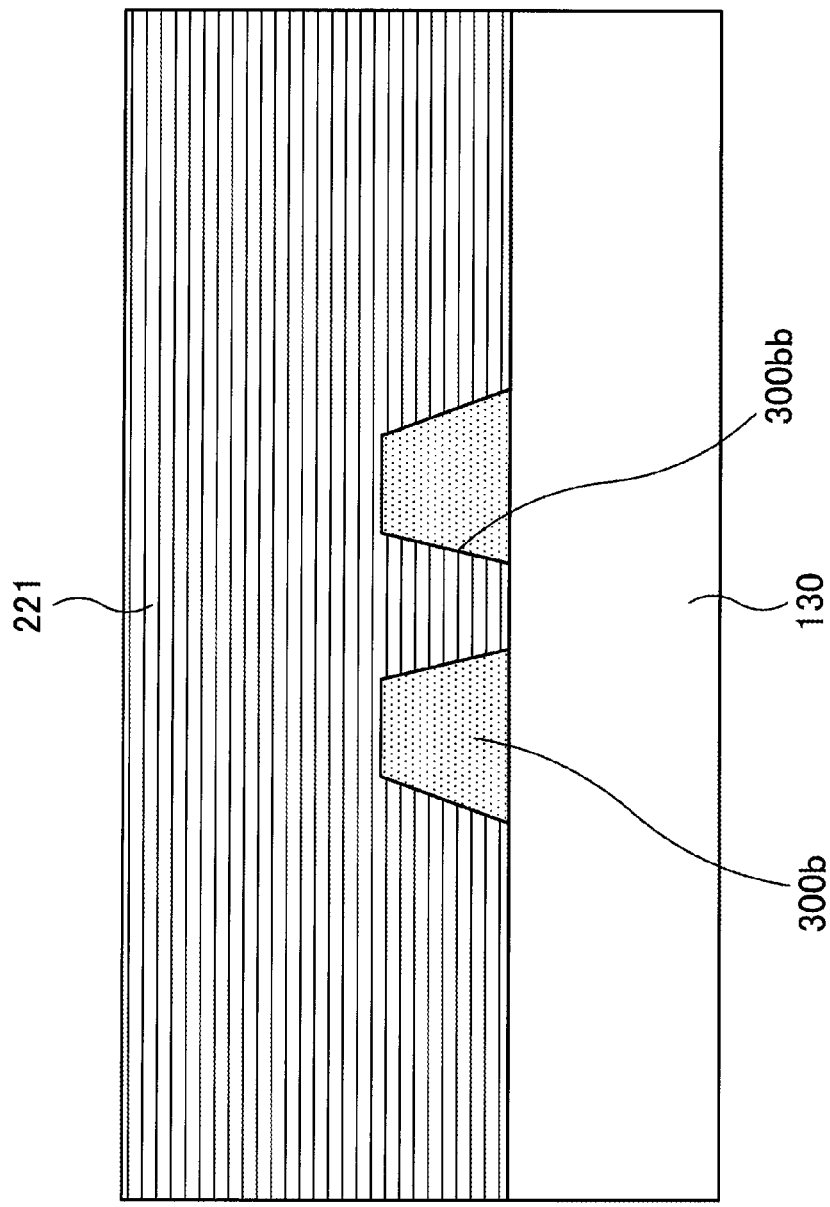
FIG. 25 illustrates a gate electrode formation method according to an embodiment (part 3)
Figure 26:
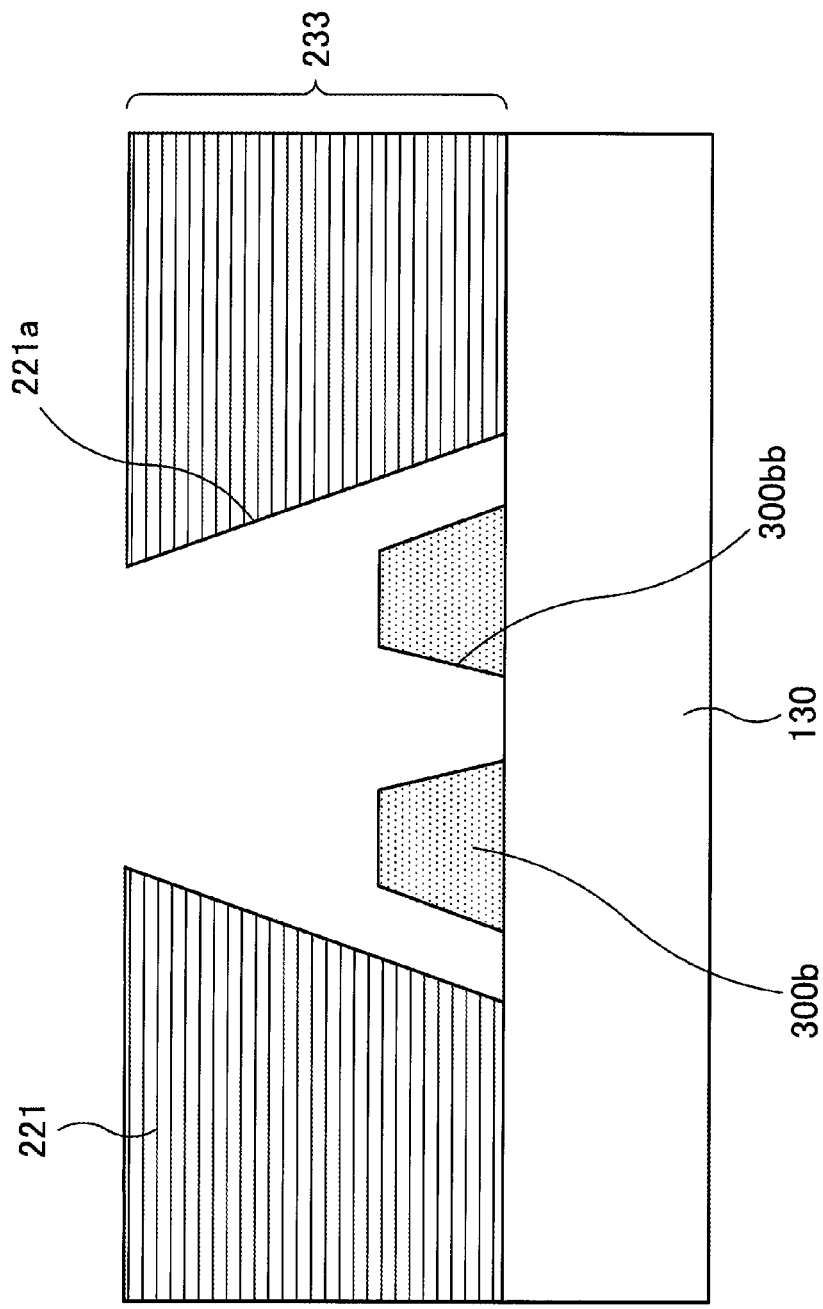
FIG. 26 illustrates a gate electrode formation method according to an embodiment (part 4)
Figure 27:
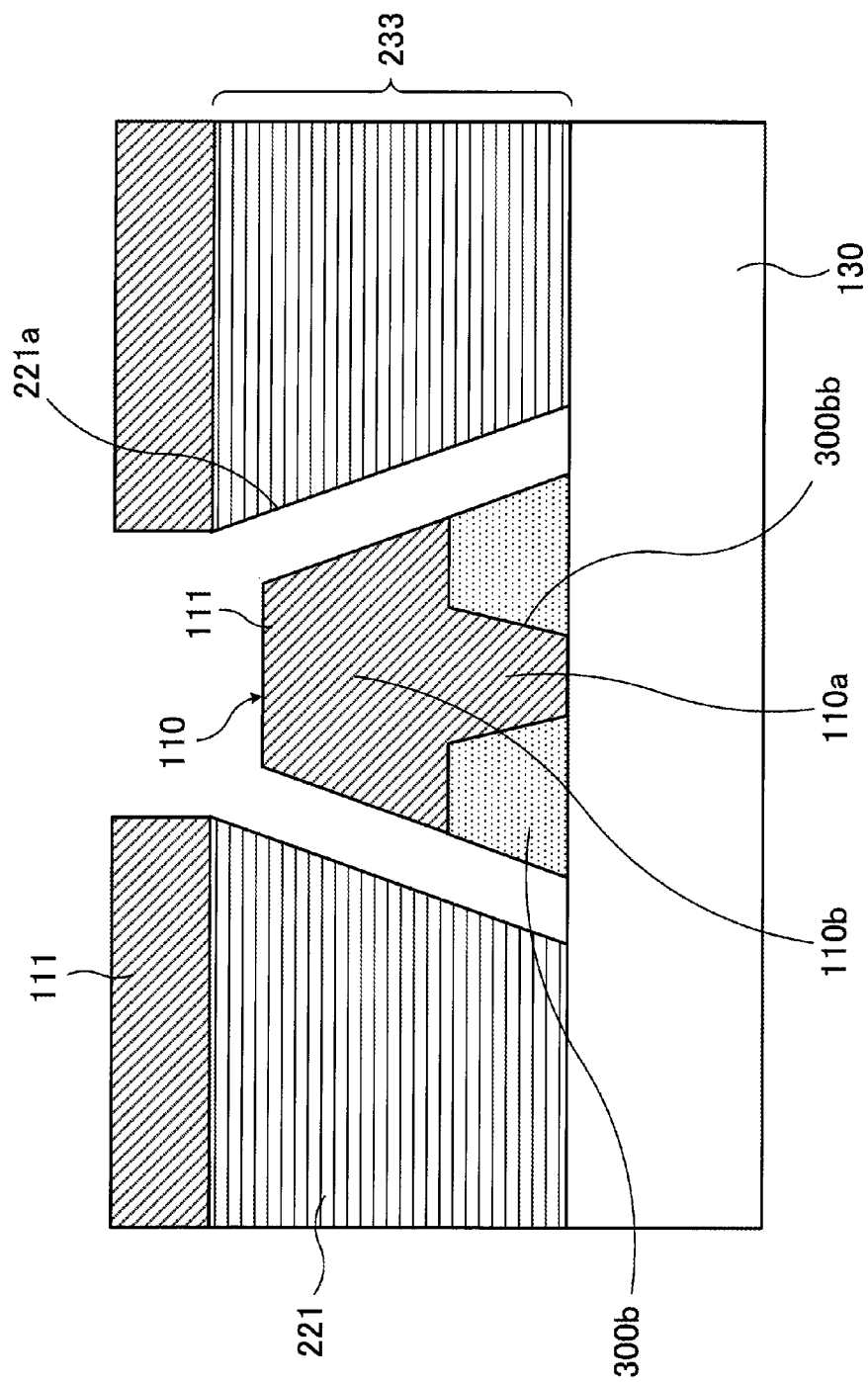
FIG. 27 illustrates a gate electrode formation method according to an embodiment (part 5)
Figure 28:
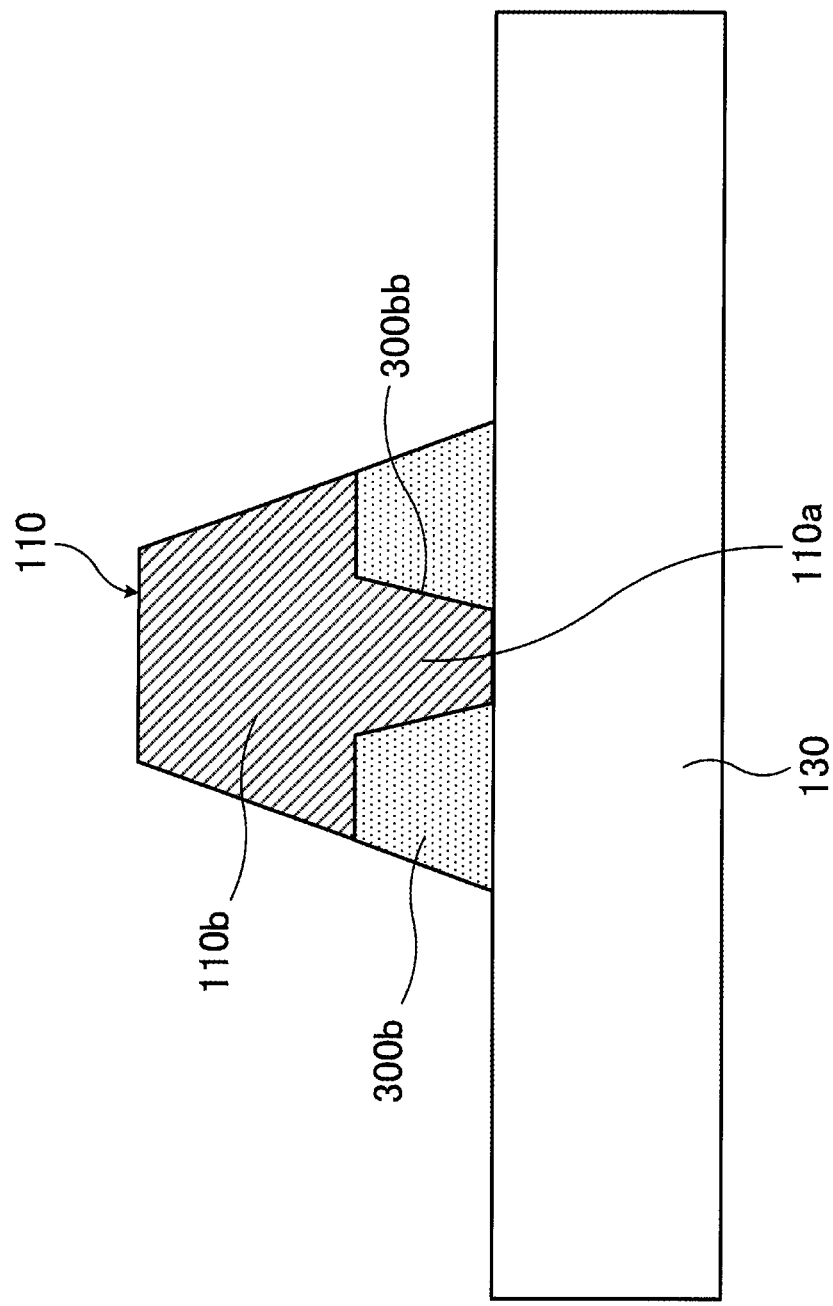
FIG. 28 illustrates a gate electrode formation method according to an embodiment (part 6)
Figure 29:
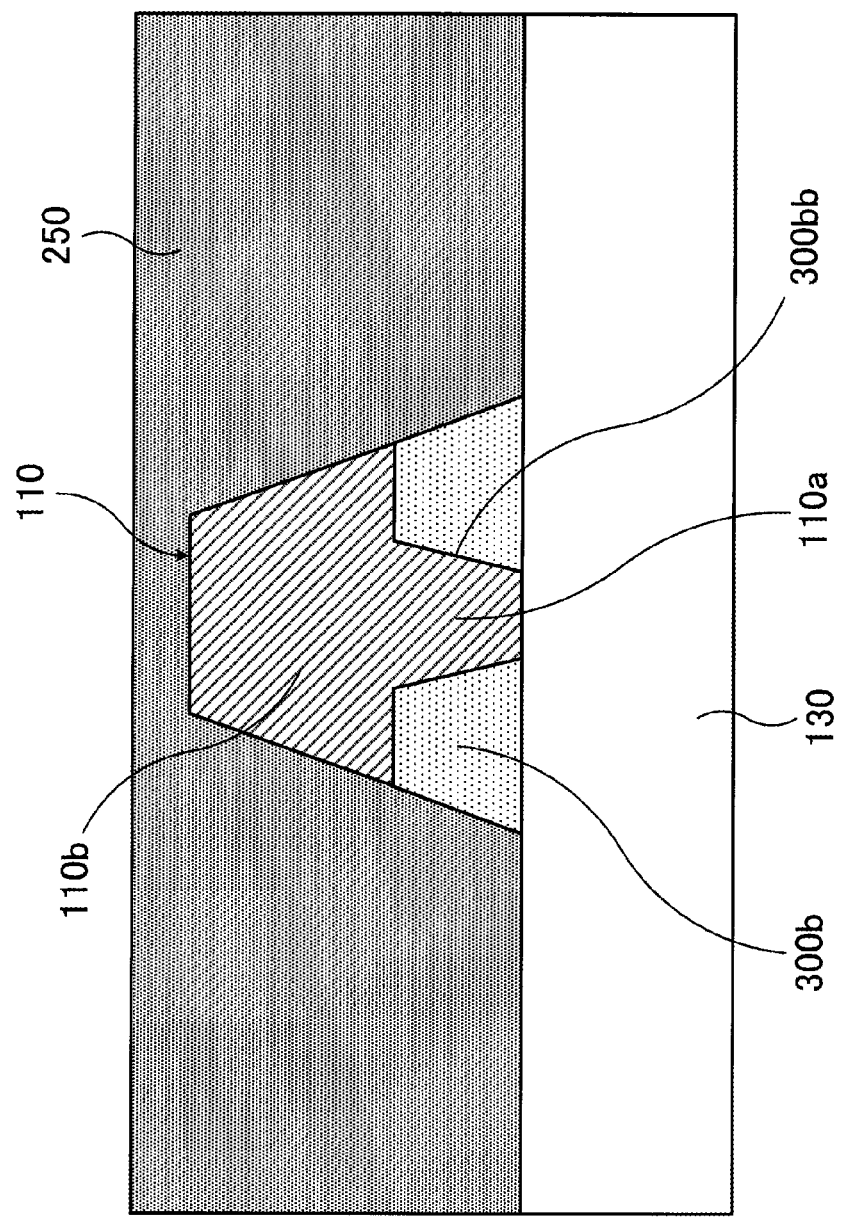
FIG. 29 illustrates a gate electrode formation method according to an embodiment (part 7)

FIGS. 23 through 29 illustrate a gate electrode formation method according to an embodiment. FIG. 23 is a fragmentary schematic sectional view of a resist composition formation process. FIG. 24 is a fragmentary schematic sectional view of a first exposure and development process. FIG. 25 is a fragmentary schematic sectional view of a resist formation process. FIG. 26 is a fragmentary schematic sectional view of a second exposure and development process. FIG. 27 is a fragmentary schematic sectional view of an electrode material deposition process. FIG. 28 is a fragmentary schematic sectional view of a resist removal process. FIG. 29 is a fragmentary schematic sectional view of an insulating film formation process.

The following gate electrode formation method includes a process for forming a comparatively low dielectric constant insulating film by the use of a negative resist composition. A portion of a negative resist composition irradiated with an energy beam, such as an electron beam, is insoluble in developer. This property is utilized for forming a comparatively low dielectric constant insulating film.

As illustrated in FIG. 23, first a negative resist composition 300 is formed by the spin coating method over the compound semiconductor region 130 (compound semiconductor layer 100) which has passed through the above processes illustrated in FIGS. 5 through 8. Heat treatment is performed on the formed resist composition 300. This heat treatment is performed at a comparatively low temperature at which a solvent component contained in the resist composition 300 is dried.

As illustrated in FIG. 24, a region of the resist composition 300 corresponding to a sidewall of the lower portion 110a of the T gate electrode 110 to be formed (region of the resist composition 300 which supports the upper portion 110b from below) is irradiated with a determined energy beam 400. The region of the resist composition 300 irradiated with the energy beam 400 cures and is insoluble in developer. After the region of the resist composition 300 is irradiated with the energy beam 400, a region of the resist composition 300 which is not irradiated with the energy beam 400 is removed by the use of developer. By doing so, an insulating film pattern (resist pattern) 300b with a concave portion 300bb illustrated in FIG. 24 is formed.

If the negative resist composition 300 is used, the insulating film pattern 300b is formed in this way in a determined region by irradiating the resist composition 300 formed over the compound semiconductor region 130 with the energy beam 400 and performing the subsequent development process. Heat treatment is performed at a comparatively low temperature at which the solvent component contained in the resist composition 300 is dried from the formation of the resist composition 300 to the formation of the insulating film pattern 300b.

The method for forming the insulating film pattern 300b which is illustrated in FIGS. 23 and 24 does not require heat treatment at a comparatively high temperature described in the above first or second example or dry etching described in the above second example. Accordingly, damage to a Schottky junction which may be caused by heat treatment at a comparatively high temperature or dry etching, variation in the size of the insulating film pattern 300b which may be caused by dry etching, or the like is controlled.

The details of the resist composition 300 and the method for forming the insulating film pattern 300b by the use of the resist composition 300 will further be described later.

After the formation of the insulating film pattern 300b, as illustrated in FIG. 25, a resist 221 is formed by the spin coating method over the compound semiconductor region 130 and the insulating film pattern 300b. As illustrated in FIG. 26, exposure and development are then performed on the resist 221 to form an opening portion 221a in a region in which the upper portion 110b of the T gate electrode 110 is to be formed. As a result, a mask pattern 233 (including the insulating film pattern 300b and the resist 221) for gate electrode formation is formed. In this case, the resist 221 having one layer is used for forming the mask pattern 233 for gate electrode formation. However, the resist 221 having two or more layers, that is to say, having a laminated structure may be used for forming the mask pattern 233.

After the formation of the mask pattern 233, as illustrated in FIG. 27, an electrode material 111 is deposited over the compound semiconductor region 130 and the mask pattern 233 by the sputtering method. The electrode material 111 which ingresses into an opening (concave portion 300bb and the opening portion 221a) in the mask pattern 233 is deposited in the concave portion 300bb in the insulating film pattern 300b and in the opening portion 221a in the resist 221 on the insulating film pattern 300b. As a result, the T gate electrode 110 is formed. That is to say, a portion deposited in the concave portion 300bb in the insulating film pattern 300b corresponds to the lower portion 110a of the T gate electrode 110 and a portion deposited in the opening portion 221a in the resist 221 on the insulating film pattern 300b corresponds to the upper portion 110b of the T gate electrode 110. The electrode material 111 is also deposited over the mask pattern 233.

After the deposition of the electrode material 111, as illustrated in FIG. 28, the resist 221 and an unnecessary electrode material 111 (deposited over the resist 221) are removed by lift-off by the use of a solvent. The lower portion 110a and the upper portion 110b of the T gate electrode 110 after the lift-off are supported by the insulating film pattern 300b. This prevents the T gate electrode 110 from falling.

As illustrated in FIG. 29, the T gate electrode 110 is covered with a comparatively high dielectric constant insulating film 250 whose film density and moisture resistance are higher than those of the insulating film pattern 300b. For example, the CVD method is used for forming the insulating film 250 by depositing silicon oxide or the like.

With this method the comparatively low dielectric constant insulating film pattern 300b is formed between the upper portion 110b of the T gate electrode 110 and the compound semiconductor region 130, so parasitic capacitance between them is controlled. In addition, the insulating film pattern 300b whose film density is comparatively low and whose moisture resistance is low is covered with the insulating film 250 whose film density and moisture resistance are higher. This prevents the insulating film pattern 300b from absorbing moisture, and prevents the appearance of a crack. That is to say, the influence of parasitic capacitance, moisture absorption, and the appearance of a crack are curbed and a high performance HEMI with high reliability is realized.

With an HEMI in which a T gate electrode 110 is formed over an insulating film pattern 300b which has a relative dielectric constant of 2.5 and in which a concave portion 300bb with a width of 80 nm is formed, for example, a cut-off frequency of current gain is improved by about twenty percent, compared with an HEMI fabricated by the method described in the above first example.

An example of the resist composition 300 used in the above method and an example of a method for forming the insulating film pattern 300b by the use of the resist composition 300 will now be described further.

The resist composition 300 contains a solvent which contains resin obtained by hydrolyzing and condensing in the presence of acid or alkali an alkoxy group-containing compound having an alkoxy group bonded to a silicon atom or a germanium atom. The resist composition 300 is a negative resist composition and a portion of the resist composition 300 irradiated with the energy beam 400 is insoluble in developer.

An alkoxy group-containing compound is represented by the following general formula (1).

$$R^1_{4-n}M(OR^2)_n \quad (1)$$

where M is a silicon (Si) atom or a germanium (Ge) atom, n is an integer of 1 to 4, $R^1$ is a hydrogen atom, a fluorine atom, an alkyl group, a vinyl group, an alicyclic group, or an aryl group with one to eight carbon atoms, or a derivative thereof, $R^1$'s may be the same or different from one another in the case of n being smaller than or equal to 2, $R^2$ is a hydrogen atom or an alkyl group, an allyl group, a vinyl group, or alicyclic group with one to eight carbon atoms, and $R^2$'s may be the same or different from one another in the case of n being greater than or equal to 2.

One or more alkoxy group-containing compounds represented by formula (1) are used and are hydrolyzed and condensed in the presence of acid or alkali. By doing so, resin contained in the resist composition 300 is produced.

For example, alkoxy group-containing compounds (silane compounds) represented by formula (1) in which M is a silicon atom include tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, propylvinyldialkoxysilane, and the like. Furthermore, for example, silane compounds obtained by substituting, in the above silane compounds, a fluorine atom for a hydrogen atom contained a group corresponding to $R^1$ in formula (1) may be used. In addition, for example, silane compounds obtained by substituting another group (aryl group, a group containing an ester bond or an ether bond, or the like) for a determined hydrogen atom contained in an alkyl group, a vinyl group, an alicyclic group, or an aryl group corresponding to $R^1$ in formula (1) in the above silane compounds may be used.

Moreover, alkoxy group-containing compounds (germane compounds) represented by formula (1) in which M is a germanium atom, that is to say, compounds obtained by substituting a germanium atom for a silicon atom contained in the above silane compounds include tetraalkoxygermanes, trialkoxygermanes, methyltrialkoxygermanes, ethyltrialkoxygermanes, propyltrialkoxygermanes, phenyltrialkoxygermanes, vinyltrialkoxygermanes, allyltrialkoxygermanes, glycidyltrialkoxygermanes, dialkoxygermanes, dimethyldialkoxygermanes, diethyldialkoxygermanes, dipropyldialkoxygermanes, diphenyldialkoxygermanes, divinyldialkoxygermanes, diallyldialkoxygermanes, diglycidyldialkoxygermanes, phenylmethyldialkoxygermanes, phenylethyldialkoxygermanes, phenylpropyltrialkoxygermanes, phenylvinyldialkoxygermanes, phenylallyldialkoxygermanes, phenylglycidyldialkoxygermanes, methylvinyldialkoxygermanes, ethylvinyldialkoxygermanes, propylvinyldialkoxygermanes, and the like. Furthermore, for example, germane compounds obtained by substituting, in the above germane compounds, a fluorine atom for a hydrogen atom contained a group corresponding to $R^1$ in formula (1) may be used. In addition, for example, germane compounds obtained by substituting, in the above germane compounds, another group (aryl group, a group containing an ester bond or an ether bond, or the like) for a determined hydrogen atom contained in an alkyl group, a vinyl group, an alicyclic group, or an aryl group corresponding to $R^1$ in formula (1) may be used.

Weight-average molecular weight (Mw) of resin (produced by the use of one or more of the above alkoxy group-containing compounds) contained in the resist composition 300 is preferably 500 to 50,000,000 and more preferably 7,000 to 48,000,000. If the weight-average molecular weight of resin is smaller than 500, the boiling point of the resin is low. As a result, when heat treatment described above and later is performed mainly for drying a solvent, a resin skeleton may be cleaved or a cleaved component may vaporize. Furthermore, if the weight-average molecular weight of resin is greater than 50,000,000, solvent-solubility (or solvent-dilutability) may be reduced.

The content of the above resin in the resist composition 300 is preferably 10 to 70 mass percent and more preferably 20 to 60 mass percent.

If the above resin is soluble in a solvent contained in the resist composition 300, there is no special limitation on the solvent. Cyclohexanone, methyl isobutyl ketone, methyl ethyl ketone, methyl cellosolve, ethyl cellosolve, octane, decane, propylene glycol, propylene glycol monomethyl ether, propylene glycol monomethyl ether acetate, diethylene glycol, propylene glycol monoethyl ether, propylene glycol monopropyl ether, or the like is used as a solvent.

In order to increase resistance to chemicals, such as acid and alkali, and moisture resistance, a silicone compound containing a hydrocarbon in its skeleton may be added to the resist composition 300 containing the above resin and solvent. Such an added compound is polydimethylcarbosilane, polyhydromethylcarbosilane, polydiethylcarbosilane, polyhydroethylcarbosilane, polycarbosilastyrene, polyphenylmethylcarbosilane, polydiphenylcarbosilane, polydimethylsilphenylenesiloxane, polymethylsilphenylenesiloxane, polydiethylsilphenylenesiloxane, polyethylsilphenylenesiloxane, polydipropylsilphenylenesiloxane, polypropylsilphenylenesiloxane, polyphenylsilphenylenesiloxane, polydiphenylsilphenylenesiloxane, polyphenylmethylsilphenylenesiloxane, polyphenylethylsilphenylenesiloxane, polyphenylpropylsilphenylenesiloxane, polyethylmethylsilphenylenesiloxane, polymethylpropylsilphenylenesiloxane, polyethylpropylsilphenylenesiloxane, or the like.

It is preferable to add 0.1 to 200 parts by weight of an added compound to 100 parts by weight of the above resin contained in the resist composition 300. If less than 0.1 parts by weight of an added compound is added to 100 parts by weight of the above resin contained in the resist composition 300, then the effect of resistance to chemicals or moisture resistance may fail to be obtained. If more than 200 parts by weight of an added compound is added to 100 parts by weight of the above resin contained in the resist composition 300, then the mechanical strength of the insulating film pattern 300b formed by the use of the resist composition 300 may fall.

There is no special limitation on a method for forming the resist composition 300. For example, after the above silane compound or germane compound is dissolved in a solvent (above solvent), a hydrolysis indicated by the following chemical formula (1A) and a condensation indicated by the following chemical formulas (2A) and (2B) are made to progress. By doing so, the resist composition 300 is formed.

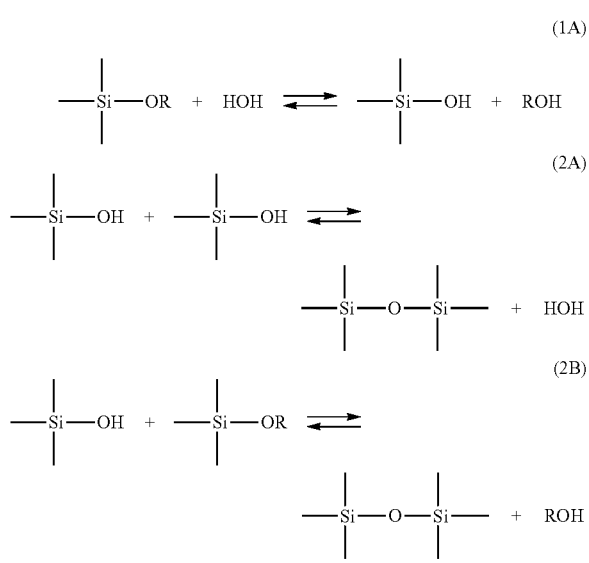

An acid catalyst, such as a strongly acid catalyst, or an alkaline catalyst, such as a strongly alkaline catalyst, is used for a hydrolysis and a condensation. An organic acid or an organic alkali may be used as a catalyst. For example, a compound which contains at least one of an aliphatic hydrocarbon, an alicyclic hydrocarbon, and an aromatic hydrocarbon in one molecule is used as an organic acid or an organic alkali. Organic acid compounds include maleic acid, acetic acid, sulfonic acid, toluene sulfonic acid, and the like. Only one or two or more of them may be used. Organic alkali compounds include pyridine, triethylamine, tetraalkylammonium hydroxide (TAAOH), and the like. Only one or two or more of them may be used.

Tetraalkylammonium hydroxide includes tetramethylammonium hydroxide, tetraethylammonium hydroxide, tetrapropylammonium hydroxide, tetrabutylammonium hydroxide, tetra-n-octylammonium hydroxide, n-hexadecyltrimethylammonium hydroxide, n-octadecyltrimethylammonium hydroxide, and the like. Only one or two or more of them may be used.

In a solvent, as indicated by formula (1A), a molecule (monomer or polymer of a silane compound or a germane compound) which contains an alkoxy group at the terminal is hydrolyzed in the presence of acid or alkali and a molecule which contains a silanol group at the terminal and alcohol are produced. In addition, in the solvent, as indicated by formula (2A), molecules each of which contains a silanol group at the terminal are condensed and resin which has a skeleton containing atom M in the main chain or in the main chain and the side chain and water are produced. Furthermore, in the solvent, as indicated by formula (2B), a molecule which contains a silanol group at the terminal and a molecule which contains an alkoxy group at the terminal are condensed and resin which has a skeleton containing atom M in the main chain or in the main chain and the side chain and alcohol are produced.

The above hydrolysis and condensation progress and resin which has a skeleton containing atom M is produced in the solvent. The resin produced may include a resin having a molecular structure in which a skeleton containing atom M extends in a line, a resin having a molecular structure in which a skeleton containing atom M spreads three-dimensionally, a resin having a basket-like molecular structure, and the like. Only one or a mixture of two or more of a resin having a molecular structure which extends intertwiningly, a resin having a molecular structure which spreads three-dimensionally, and a resin having a basket-like molecular structure is produced in the solvent, depending on conditions (type, amount, and the like of a monomer, a solvent, and a catalyst) under which the hydrolysis and the condensation are performed. Resins produced form a plurality of clusters in the solvent and the solvent, the catalyst, alcohol produced by the hydrolysis and the condensation, and the like are contained in a gap between resins in each cluster.

The resist composition 300 is obtained by the use of this method. The resin content of the resist composition 300 may be adjusted at need, for example, by removing a certain amount of the solvent, alcohol, or the like from the obtained resist composition 300 or adding the solvent to the obtained resist composition 300.

Figure 30:
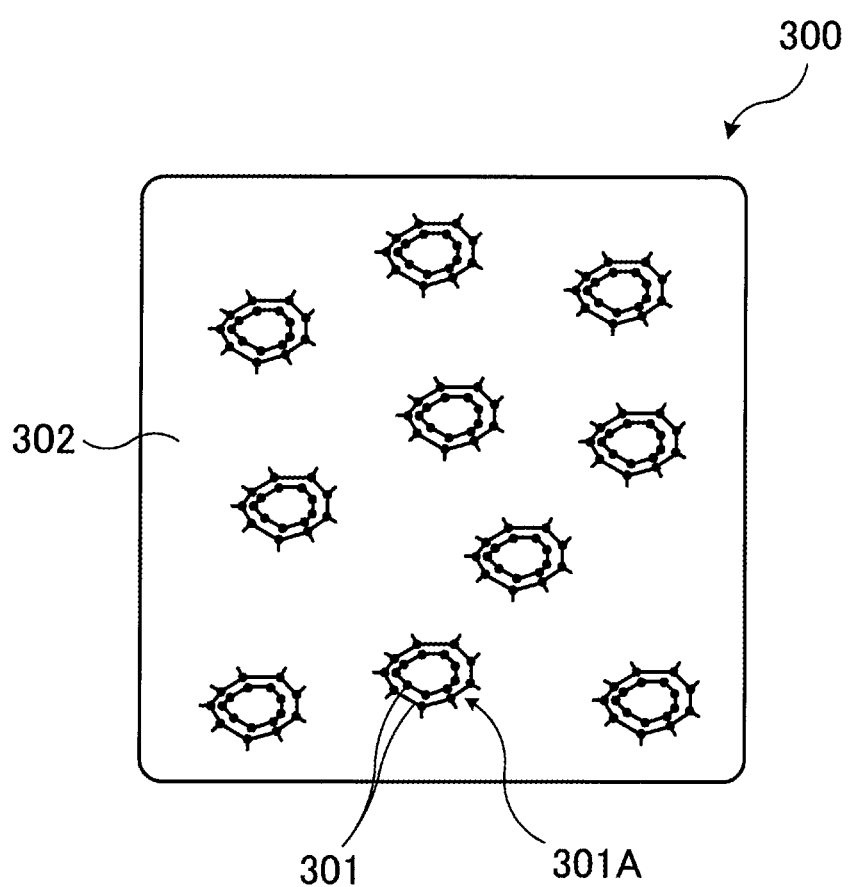
FIG. 30 schematically illustrates an example of a resist composition.

FIG. 30 schematically illustrates an example of the resist composition.

The resist composition 300 illustrated in FIG. 30 contains clusters 301A formed by resins 301 and a solvent 302. In the example of FIG. 30, a state in which the clusters 301A formed by the resins 301 each having a basket-like molecular structure are dispersed in the solvent 302 is schematically illustrated. In the example of FIG. 30, the clusters 301A are individually dispersed in the solvent 302. However, there may be a case where a plurality of clusters 301A form an aggregation and where aggregations are dispersed in the solvent 302.

In addition to the clusters 301A formed by the resins 301, a catalyst used for producing the resins 301 is contained in the solvent 302. The catalyst is acid or alkali. A silane compound or a germane compound is hydrolyzed and condensed in the presence of the catalyst. By doing so, the resins 301 and the clusters 301A are produced. The hydrolysis and the condensation partly occur in the solvent 302. The resist composition 300 does not gel and the resins 301 and the clusters 301A are produced.

Next, a method for forming the insulating film pattern 300b by the use of the above resist composition 300 will be described.

Figure 31:
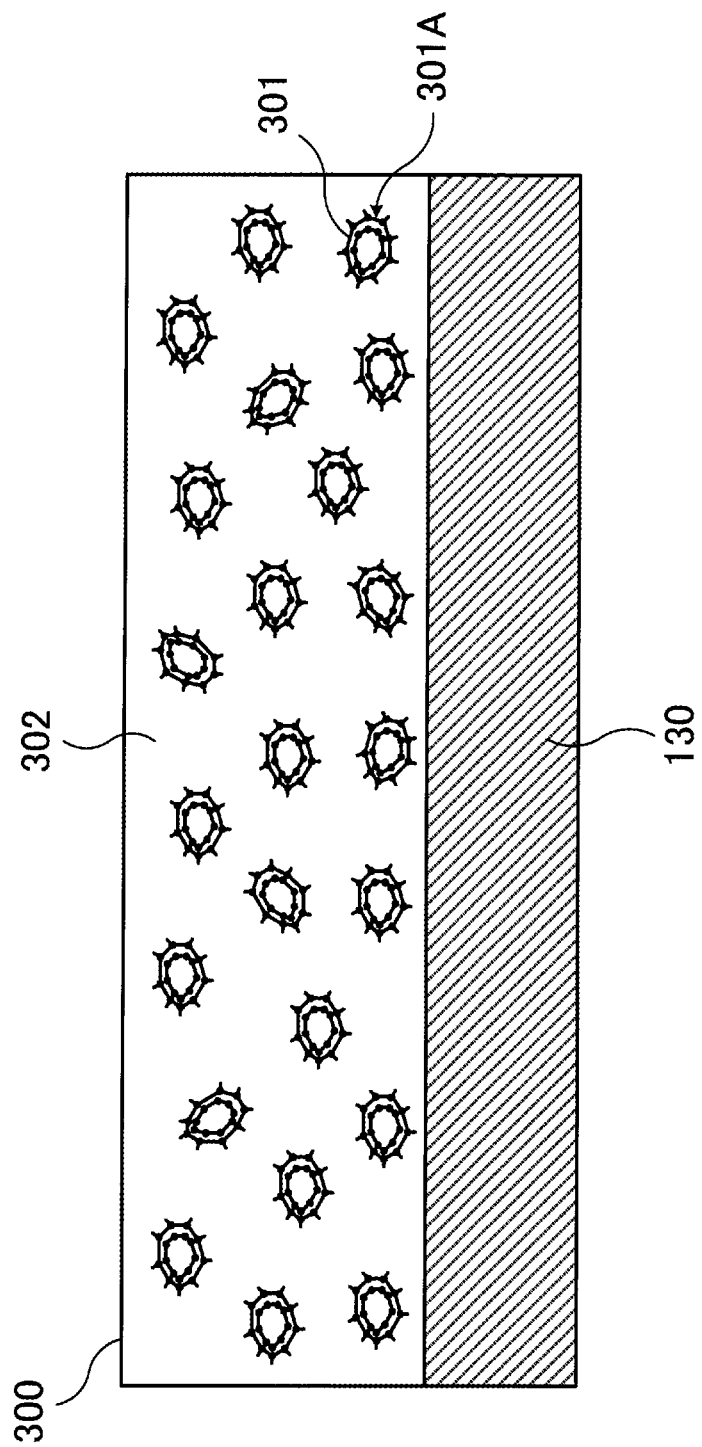
FIG. 31 schematically illustrates an example of a resist composition coating process.

FIG. 31 schematically illustrates an example of a resist composition coating process.

As illustrated in FIG. 31, first the above resist composition 300 is formed over a substrate, that is to say, over the compound semiconductor region 130 described in the above example of an HEMT. The resist composition 300 is formed over the compound semiconductor region 130 by a coating method. When the resist composition 300 is formed, the resist composition 300 is not made to gel so that it will have certain fluidity. As a result, the resist composition 300 can be formed over the compound semiconductor region 130 by a coating method. A coating method other than the above spin coating method may be used for forming the resist composition 300. A dip coating method, a kneader coating method, a curtain coating method, or a blade coating method may be used. The spin coating method or the dip coating method is desirable from the viewpoint of coating efficiency.

After the resist composition 300 is formed in this way over the compound semiconductor region 130, heat treatment, irradiation with the energy beam 400, and development are performed.

Figure 32:
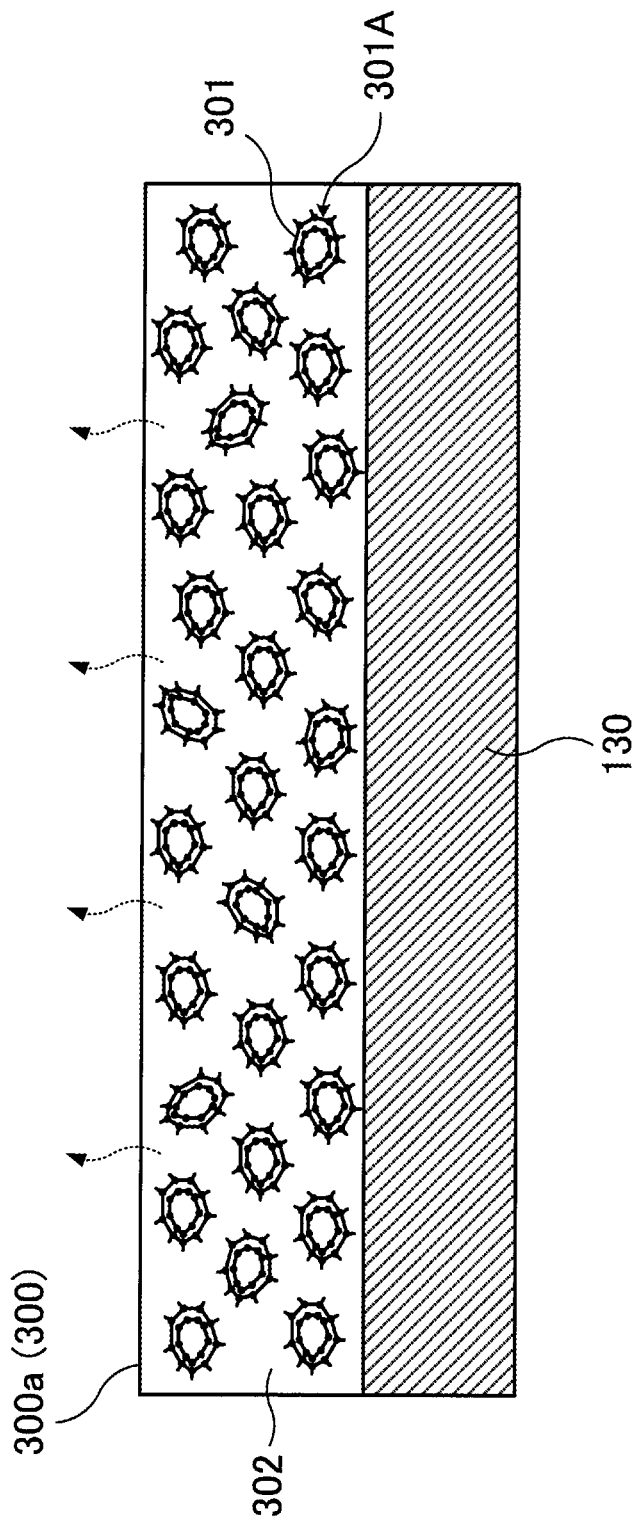
FIG. 32 schematically illustrates an example of a heat treatment process.

FIG. 32 schematically illustrates an example of a heat treatment process.

After the resist composition 300 is formed over the compound semiconductor region 130 by coating, heat treatment is performed mainly for drying the solvent 302 contained in the resist composition 300. Completely drying the solvent 302 contained in the resist composition 300 is not required in this heat treatment. It is desirable to perform the heat treatment at a temperature of 50 to 300° C. It is more desirable to perform the heat treatment at a temperature of 100 to 250° C. The solvent 302 evaporates from around the resins 301 and the clusters 301A and from gaps between the resins 301 and between the clusters 301A in the resist composition 300 (indicated by dotted-line arrows in FIG. 32) by the heat treatment and a resist 300a (resist composition 300) is formed over the compound semiconductor region 130.

When the solvent 302 evaporates by the heat treatment, the volume of the resist 300a over the compound semiconductor region 130 may shrink. In addition, when the heat treatment is performed, rearrangement or aggregation of the resins 301 or the clusters 301A may occur or bonding may occur between the resins 301 and the clusters 301A (hydrolysis and condensation) by the function of the catalyst in the solvent 302.

The processes illustrated in FIGS. 31 and 32 correspond to the above process illustrated in FIG. 23.

Figure 33:
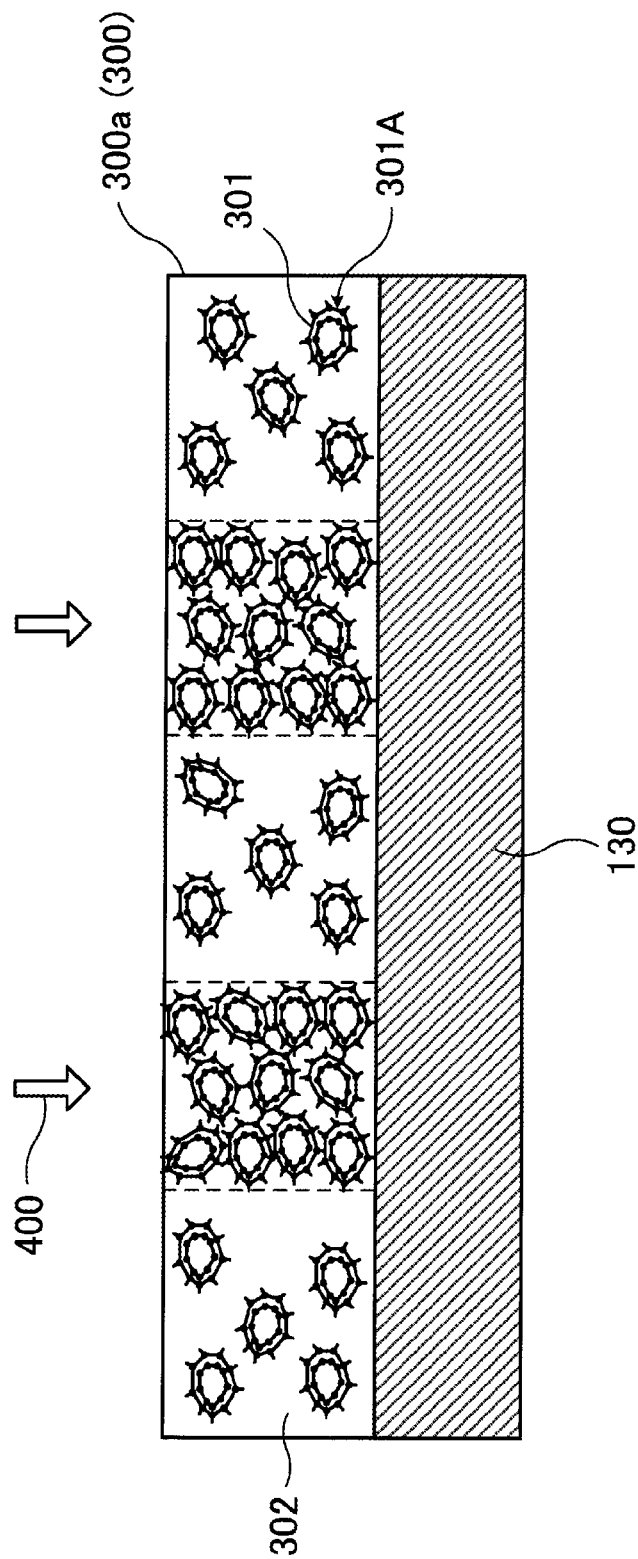
FIG. 33 schematically illustrates an example of an energy beam irradiation process.

FIG. 33 schematically illustrates an example of an energy beam irradiation process.

As illustrated in FIG. 33, a determined portion of the resist 300a is selectively irradiated with the energy beam 400 after the resist 300a is formed over the compound semiconductor region 130 by the heat treatment. An infrared ray, a visible ray, an ultraviolet ray, an eximer laser beam, an X-ray, an electron beam, or the like is used as the energy beam 400 with which the resist 300a is irradiated.

When a determined portion of the resist 300a is irradiated with the energy beam 400, evaporation of the solvent 302 progresses in the portion of the resist 300a irradiated with the energy beam 400. At the same time hydrolysis and condensation indicated by formula (1A), formula (2A), and formula (2B) progress among the clusters 301A formed by the resins 301 in the portion of the resist 300a irradiated with the energy beam 400, for example, by the function of the residual catalyst. When evaporation of the solvent 302 and hydrolysis and condensation of the clusters 301A progress in this way by irradiation with the energy beam 400, the portion of the resist 300a irradiated with the energy beam 400 cures (gels). As a result, a latent image of a pattern is formed.

The cured portion of the resist 300a corresponding to the latent image of the pattern is insoluble in a determined developer (negative). A three-dimensional meshy structure is formed by the resins 301 in the cured portion of the resist 300a as a result of the progress of evaporation of the solvent 302 and the like by irradiation with the energy beam 400 and hydrolysis and condensation of the resins 301 and the clusters 301A. Gaps in the three-dimensional meshy structure are pores.

In order to accelerate hydrolysis and condensation of the clusters 301A in the resist 300a, it is desirable to use an active energy beam, such as an ultraviolet ray, an eximer laser beam, an X-ray, or an electron beam, as the energy beam 400. If an ultraviolet ray is used, it is desirable that its wavelength be 450 nm or less. If an eximer laser beam is used, a krypton fluoride (KrF) eximer laser beam (having a wavelength of 248 nm), an argon fluoride (ArF) eximer laser beam (having a wavelength of 193 nm), a fluorine ($F_2$) eximer laser beam (having a wavelength of 157 nm), or the like is desirable.

Furthermore, in order to accelerate and uniformalize hydrolysis and condensation of the clusters 301A in the resist 300a, heat treatment may be performed further after the irradiation with the energy beam 400 at a temperature at which the compound semiconductor region 130 does not suffer damage.

Figure 34:
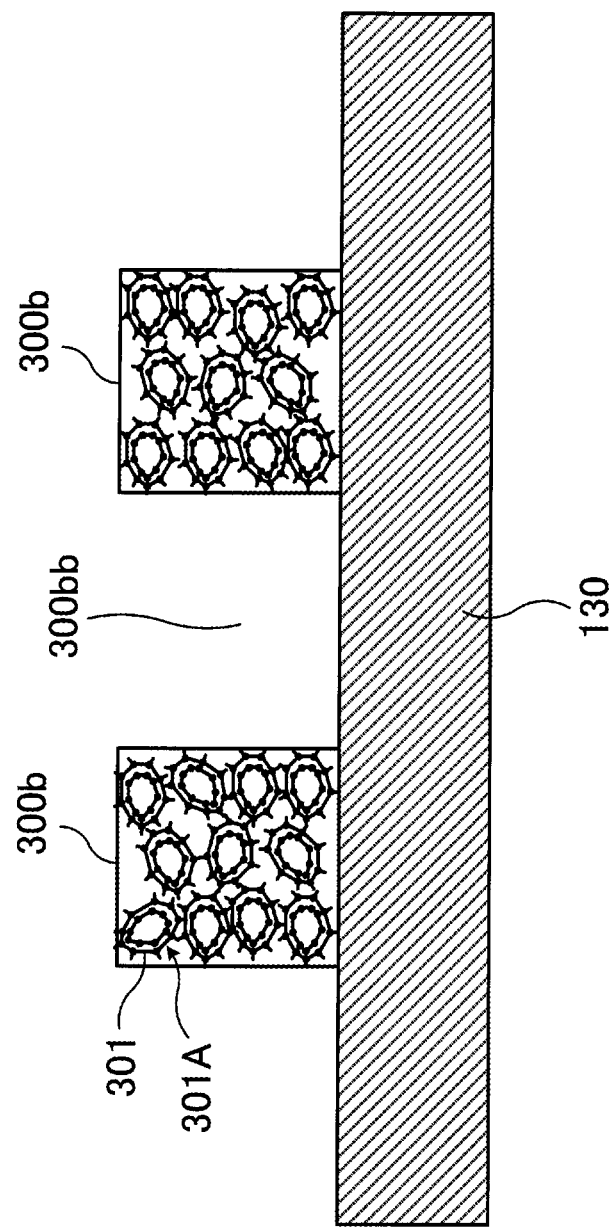
FIG. 34 schematically illustrates an example of a development process.

FIG. 34 schematically illustrates an example of a development process.

After the irradiation of the resist 300a over the compound semiconductor region 130 with the energy beam 400, as illustrated in FIG. 34, a portion (uncured portion) of the resist 300a not irradiated with the energy beam 400 is dissolved in a determined developer and is removed from over the compound semiconductor region 130. By doing so, development is performed.

Developer which can dissolve the uncured portion of the resist 300a is used. There is no other limitation on developer to be used. For example, the solvent 302 used in the resist composition 300, water, an alkali aqueous solution, or the like may be used.

Alkali used for developer includes inorganic alkali such as sodium hydroxide, potassium hydroxide, sodium silicate, or ammonia, primary amine such as ethylamine or propylamine, secondary amine such as diethylamine or dipropylamine, tertiary amine such as trimethylamine or triethylamine, alcoholamine such as diethylethanolamine or triethanolamine, quaternary ammonium hydroxide such as tetramethylammonium hydroxide, tetraethylammonium hydroxide, tetrabutylammonium hydroxide, triethylhydroxymethylammonium hydroxide, trimethylhydroxyethylammonium hydroxide, and the like.

Furthermore, a water-soluble organic solvent, such as methyl alcohol, ethyl alcohol, propyl alcohol, or ethylene glycol, a surfactant, an inhibitor for dissolving the resins 301, or the like may be added to an alkali aqueous solution at need.

By dissolving and removing the uncured portion of the resist 300a in this way by the use of the determined developer, the insulating film pattern 300b in which the concave portion 300bb is formed and which has pores is formed over the compound semiconductor region 130.

The processes illustrated in FIGS. 33 and 34 correspond to the above process illustrated in FIG. 24.

With the method for forming the insulating film pattern 300b illustrated in FIGS. 31 through 34, patterning is performed by irradiation of the resist composition 300 with the energy beam 400 and the subsequent development process. Accordingly, heat treatment at a high temperature and dry etching are unnecessary. This prevents damage to a Schottky junction, variation in the insulating film pattern 300b, or the like which is caused by heat treatment or dry etching. In the above second example (FIGS. 16 and 17), the resist 211 is formed and dry etching is performed with the resist 211 as a mask. In this case, however, these processes are unnecessary. As a result, man-hours or costs required for forming the insulating film pattern 300b or fabricating an HEMT are reduced.

After the insulating film pattern 300b having the concave portion 300bb is formed by the method illustrated in FIGS. 31 through 34, the above processes illustrated in FIGS. 25 through 29 are performed. By doing so, a high performance HEMT with high reliability is efficiently realized at a low cost.

Furthermore, with the method for forming the template insulating film 240 described in the above first and second examples (FIGS. 15 and 16), a path along which the template decomposed and removed passes becomes a pore. As a result, a huge pore or a long pore may be formed in the insulating film 240. If such a pore is formed, the mechanical strength of the insulating film 240 may fall or the electrode material 111 formed over the insulating film 240 may diffuse into it. This leads to deterioration in the performance or reliability of an HEMT. With the method for forming the insulating film pattern 300b, on the other hand, the resins 301 and the clusters 301A are produced and bonded. As a result, a three-dimensional meshy structure is formed by the resins 301 and pores are formed by removing the solvent 302. This prevents the formation of a huge pore or a long pore. Accordingly, the insulating film pattern 300b having high mechanical strength is formed.

Forming the insulating film pattern 300b by the use of the resist composition 300 has been described.

The diameter or density of pores formed in the insulating film pattern 300b is controlled by the type (molecular structure or combination) of an alkoxy group-containing compound represented by general formula (1) which is used for the resist composition 300, the type or amount of a solvent or a catalyst, or the like. There is no special limitation on the diameter (average diameter) of pores in the insulating film pattern 300b. The diameter of pores is properly selected according to a use for the insulating film pattern 300b. For example, if the insulating film pattern 300b is formed in the above HEMT, then the diameter of pores is preferably 10 nm or less and more preferably 8 nm or less, from the viewpoint of lowering a dielectric constant. The diameter of pores is observed and measured by the use of, for example, a transmission electron microscope (TEM).

There is no special limitation on the thickness of the insulating film pattern 300b. The thickness of the insulating film pattern 300b is properly selected according to a use for the insulating film pattern 300b. The thickness of the insulating film pattern 300b is preferably about 20 to 3000 nm from the viewpoint of forming a low dielectric constant insulating film pattern 300b with excellent homogeneity having pores.

In addition, the resist composition 300 contains a catalyst which acts on production of the resins 301 and the clusters 301A by hydrolysis and condensation of an alkoxy group-containing compound and bonding between the resins 301 and the clusters 301A by irradiation with the energy beam 400. Using the above organic acid or organic alkali as the catalyst prevents the appearance of a defect (non-uniformity) in the molecular structure of the resins 301 at the time of forming the insulating film pattern 300b (performing irradiation with the energy beam 400 and curing the resist 300a). Furthermore, if the above organic alkali is used as the catalyst, molecules of the resins 301 having high density are formed at the time of forming the insulating film pattern 300b (performing irradiation with the energy beam 400 and curing the resist 300a), compared with a case where the above organic acid is used. Accordingly, mechanical strength is improved.

Inorganic acid, such as nitric acid, hydrochloric acid, or sulfuric acid, may be used as the catalyst in place of the above organic acid or organic alkali.

The main skeleton of the molecular structure of the resins 301 contained in the resist composition 300 and the resist 300a made therefrom is a silicon atom or a germanium atom. Sensitivity to an electron beam used as the energy beam 400 with which the resist 300a is irradiated depends on the number of secondary electrons generated in the resist 300a. Accordingly, if the resist 300a and the resist composition 300 contain the resins 301 whose main skeleton is a germanium atom, that is to say, the resins 301 produced by the use of a germane compound, sensitivity to an electron beam used as the energy beam 400 is high.

In addition, if a compound containing an aryl group or a derivative thereof as $R^1$ in general formula (1) is used as an alkoxy group-containing compound represented by general formula (1), then sensitivity to an electron beam used as the energy beam 400 is improved. For example, a compound containing as $R^1$ in general formula (1) a group obtained by removing one or more hydrogen atoms from benzene, naphthalene, anthracene, phenanthrene, triphenylene, pyrene, chrysene, or naphthacene is used. More specifically, a compound containing as $R^1$ in general formula (1) a 1-naphthyl group, a 2-naphthyl group, a 1-anthracenyl group, a 2-anthracenyl group, a 1-phenanthryl group, a 2-phenanthryl group, 3-phenanthryl group, a 1-pyrenyl group, or the like is used. By using an alkoxy group-containing compound containing an aryl group as $R^1$ in general formula (1) as all or a part of alkoxy group-containing compounds used for forming the resist composition 300, the resist composition 300 and the resist 300a whose sensitivity to an electron beam is high are obtained.

However, if an alkoxy group-containing compound containing an aryl group as $R^1$ in general formula (1) is used as all of alkoxy group-containing compounds used for forming the resist composition 300, the number of pores formed in the insulating film pattern 300b may be comparatively small. In such a case, an alkoxy group-containing compound containing an organic functional group, such as an alkyl group, a vinyl group, or an alicyclic group, as $R^1$ in general formula (1) is added to an alkoxy group-containing compound containing an aryl group as $R^1$ in general formula (1). Furthermore, an alkoxy group-containing compound which is a tetrafunctional substance (n=4) of alkoxy group $OR^2$ may be added to an alkoxy group-containing compound containing an aryl group as $R^1$ in general formula (1). In addition, an alkoxy group-containing compound containing an organic functional group, such as an alkyl group, as $R^1$ in general formula (1) and an alkoxy group-containing compound which is a tetrafunctional substance of alkoxy group $OR^2$ may both be added to an alkoxy group-containing compound containing an aryl group as $R^1$ in general formula (1). By adding an alkoxy group-containing compound of another type in this way to an alkoxy group-containing compound containing an aryl group as $R^1$ in general formula (1) whose sensitivity to an electron beam is high, their copolymers are produced in the resist composition 300 and the resist 300a and the formation of pores is accelerated. In addition, the use of alkoxy group-containing compounds of plural types prevents a shrinkage in the volume of the resist 300a caused by electron beam irradiation.

Furthermore, an alkoxy group-containing compound containing a decomposable group decomposed (cleaved) at the time of determined energy being provided may be used as an alkoxy group-containing compound used for the resist composition 300. For example, an alkoxy group-containing compound containing a decomposable group decomposed at the time of being heated at a temperature of 150 to 350° C. or at the time of being irradiated with the energy beam 400 is used. Such a decomposable group is preferably, for example, a functional group which corresponds to $R^1$ in general formula (1) and which contains at least one of an ester bond and an ether bond. By using an alkoxy group-containing compound containing such a decomposable group, the resins 301 containing a decomposable group are produced in the resist composition 300 and the decomposable groups are decomposed at the time of being heated at a determined temperature or at the time of being irradiated with the energy beam 400. Polymerization progresses further with terminals of the resins 301 whose decomposable groups are decomposed in this way as new reactive sites, pores are formed, film density is increased, and so on. If the decomposable groups are decomposed at a temperature lower than 150° C., a pore formation effect by the introduction of decomposable groups may fail to be fully obtained. If the decomposable groups are decomposed at a temperature higher than 350° C., gelation of the resist 300a progresses. As a result, it may be difficult to form pores, or significant metamerism of the skeletons of the resins 301 may occur.

Examples of the above resist composition, forming an insulating film pattern by the use of the resist composition, and fabricating an HEMI by the use of the insulating film pattern will now be given.

EXAMPLE 1

20.8 g (0.1 mol) of tetraethoxysilane, 17.8 g (0.1 mol) of methyltriethoxysilane, 24.8 g (0.1 mol) of 1-naphthyltrimethoxysilane, and 40 g of methyl isobutyl ketone are put in a 200-milliliter reaction vessel. 16.2 g (0.9 mol) of an aqueous solution of nitric acid containing nitric acid at 400 ppm is dropped into the reaction vessel over 10 minutes. After the dropping ends, an aging reaction is carried out for 2 hours. 5 g of magnesium sulfate is then added to remove excess moisture. After that, ethanol produced by the aging reaction is removed by the use of a rotary evaporator until the volume of the reaction solution becomes 50 ml. 20 ml of methyl isobutyl ketone is added to the resultant reaction solution. Methyl isobutyl ketone is then removed in an oven at 200° C. As a result, a resist composition having a solid content concentration of 17.0% by weight is obtained.

EXAMPLE 2

25.3 g (0.1 mol) of tetraethoxygermanes, 22.3 g (0.1 mol) of methyltriethoxygermanes, 24.8 g (0.1 mol) of 1-naphthyltrimethoxysilane, and 40 g of methyl isobutyl ketone are put in a 200-milliliter reaction vessel. 16.2 g (0.9 mol) of a 1% aqueous solution of tetramethylammonium hydroxide is dropped into the reaction vessel over 10 minutes. After the dropping ends, an aging reaction is carried out for 2 hours. 5 g of magnesium sulfate is then added to remove excess moisture. After that, ethanol produced by the aging reaction is removed by the use of a rotary evaporator until the volume of the reaction solution becomes 50 ml. 20 ml of methyl isobutyl ketone is added to the resultant reaction solution. Methyl isobutyl ketone is then removed in an oven at 200° C. As a result, a resist composition having a solid content concentration of 16.1% by weight is obtained.

EXAMPLE 3

A methyl isobutyl ketone solution of hydrogen silsesquioxane is prepared and is diluted with methyl isobutyl ketone. As a result, a resist composition having a solid content concentration of 15.0% by weight is obtained.

EXAMPLE 4

An HEMI is formed in accordance with the above processes illustrated in FIGS. 5 through 8 and 23 through 29.

As illustrated in FIG. 5, first the MOVPE method is used for making the AlN layer 131 (buffer layer), the GaN layer 132 (electron transit layer), the AlGaN layer 133 (electron supply layer), and the GaN layer 134 (surface layer) epitaxial-grow over the semi-insulating SiC substrate 120 in that order. By doing so, the compound semiconductor region 130 is formed. Ar is selectively implanted in the formed compound semiconductor region 130 to form the isolation regions 140 which pierce the compound semiconductor region 130 and which reach the SiC substrate 120.

Next, as illustrated in FIG. 6, the resist 150 having the opening portions 150a in the regions where the source electrode and the drain electrode are to be formed is formed over the compound semiconductor region 130 and the isolation regions 140. As illustrated in FIG. 7, the GaN layer 134 which is exposed in the opening portions 150a is then etched by performing dry etching by the use of chlorine-based gas containing an inert gas, chlorine ($Cl_2$) gas, and the like with the resist 150 as a mask. In this case, a part of the GaN layer 134 may remain over the AlGaN layer 133 or a part of the AlGaN layer 133 may be etched.

As illustrated in FIG. 8, the source electrode 160a and the drain electrode 160b are then formed in etched regions. At this time, for example, a titanium (Ti) layer with a thickness of about 20 nm and an Al layer with a thickness of about 200 nm are formed first in order by the deposition method. The resist 150, together with the Ti layer and the Al layer formed thereover, is then removed. Anneal is then performed at a temperature of about 550° C. to ohmic-connect the AlGaN layer 133 to the source electrode 160a and the drain electrode 160b.

As illustrated in FIG. 23, the compound semiconductor region 130 is then coated by the spin coating method (at 2,000 revolutions per minute for 30 seconds) with the negative resist composition 300 obtained in one of examples 1 through 3. After that, heat treatment is performed at a temperature of 150° C. to dry a certain amount of a solvent contained in the resist composition 300. The resist composition 300 is then irradiated with an electron beam used as the energy beam 400 by electron beam lithography to draw two line patterns with a width of 300 nm at an interval of 100 nm. After that, portions of the resist composition 300 not irradiated with an electron beam are removed (developed) by the use of an aqueous solution of tetramethylammonium hydroxide to form the insulating film pattern 300b illustrated in FIG. 24.

As illustrated in FIG. 25, the resist 221 having a two-layer structure is then formed by the spin coating method over the compound semiconductor region 130 and the insulating film pattern 300b. First an upper-layer resist (ZEP520-A manufactured by Nippon Zeon Co. Ltd.) of the resist 221 having a two-layer structure is irradiated with an electron beam by the electron beam lithography and development is performed by the use of a liquid mixture of methyl ethyl ketone and methyl isobutyl ketone. By doing so, an opening with a width of 0.6 μm is formed in the upper-layer resist. Furthermore, a lower-layer resist (PMGI manufactured by Micro-Chem. Corp.) of the resist 221 is etched to a position on each side 0.2 μm inside the edge of the opening in the upper-layer resist by the use of an aqueous solution of tetramethylammonium hydroxide with the upper-layer resist as a mask. By doing so, as illustrated in FIG. 26, the resist 221 having the opening portion 221a whose section has a taper shape is formed. As a result, the mask pattern 233 (including the insulating film pattern 300b and the resist 221) for gate electrode formation is formed.

As illustrated in FIG. 27, first an evaporation method is then used for depositing a nickel (Ni) layer with a thickness of about 10 nm and a gold (Au) layer with a thickness of 300 nm in order over the compound semiconductor region 130 and the mask pattern 233 as the electrode material 111. By doing so, the T gate electrode 110 is formed.

Next, as illustrated in FIG. 28, the resist 221 and an unnecessary electrode material 111 are removed by lift-off by the use of a warmed organic solvent. As illustrated in FIG. 29, the insulating film 250 whose moisture resistance is higher than that of the insulating film pattern 300b is then deposited by the CVD method to cover the T gate electrode 110 and the insulating film pattern 300b with the insulating film 250.

As has been described, HEMTs are formed in accordance with the processes illustrated in FIGS. 23 through 29 by the use of resist compositions 300 obtained in examples 1 through 3, and high-temperature energization experiments are performed on them. Furthermore, a high-temperature energization experiment is also performed for comparison on an HEMI (example for comparison) formed in accordance with the processes illustrated in FIGS. 9 through 15.

With all the HEMTs formed by the use of the resist compositions 300 obtained in examples 1 through 3, there is no tendency for gate leakage current or pinch-off current, at the time of performing pinch-off energization at a temperature of 160° C., to increase. With the HEMI which is an example for comparison, on the other hand, gate leakage current and pinch-off current increase about 40 minutes after the beginning of energization. This means that the HEMT deteriorates. Judging from these results, it may safely be said that the HEMTs which are formed in accordance with the processes illustrated in FIGS. 23 through 29 by the use of the resist compositions 300 obtained in examples 1 through 3 are highly reliable.

In the above description the HEMT having a structure in which the T gate electrode 110 is formed over the insulating film pattern 300b formed from the resist composition 300 and in which the T gate electrode 110 and the insulating film pattern 300b are covered with the insulating film 250 whose moisture resistance is higher than that of the insulating film pattern 300b is taken as an example. This structure is also applicable to another form of transistor, such as a MIS (Metal Insulator Semiconductor) transistor including a T gate electrode.

By applying the insulating film pattern 300b formed from the resist composition 300 to insulating films, such as the above insulating films 20 illustrated in FIGS. 1 through 3, in various semiconductor devices around which parasitic capacitance may be generated, a high performance semiconductor device with high reliability is realized.

According to the disclosed art, an insulating film around which parasitic capacitance may be generated is covered with an insulating film which has higher film density and higher moisture resistance. This prevents moisture absorption. As a result, a high performance semiconductor device with high reliability is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a substrate;
   a first insulating film that is a solid, formed over a part of a first plane of the substrate;
   a first conductive portion formed over a surface of the first insulating film; and
   a second insulating film which covers the first plane, the first insulating film, and the first conductive portion and whose moisture resistance is higher than moisture resistance of the first insulating film; wherein
   the first insulating film has an opening portion which reaches the first plane;
   the first conductive portion is formed over a top of the first insulating film and in the opening portion; and
   a part of the second insulating film comes in direct contact with the first plane.

2. A semiconductor device comprising:
   a substrate;
   a first insulating film that is a solid, formed over a part of a first plane of the substrate;
   a first conductive portion formed over a surface of the first insulating film;
   a second insulating film which covers the first plane, the first insulating film, and the first conductive portion and whose moisture resistance is higher than moisture resistance of the first insulating film; and
   a second conductive portion formed over the substrate; wherein
   the first conductive portion is formed on a side of the first insulating film so that the first insulating film is between the first conductive portion and the second conductive portion;
   the second insulating film covers the first plane, the first insulating film, the first conductive portion, and the second conductive portion; and
   a part of the second insulating film comes in direct contact with the first plane.

3. A semiconductor device comprising:
   a substrate;
   a first insulating film that is a solid, formed over a part of a first plane of the substrate;
   a first conductive portion formed over a surface of the first insulating film; and
   a second insulating film which covers the first plane, the first insulating film, and the first conductive portion and whose moisture resistance is higher than moisture resistance of the first insulating film; wherein
   the first insulating film is a porous insulating film; and
   a part of the second insulating film comes in direct contact with the first plane.

4. A semiconductor device fabrication method comprising:
   forming a first insulating film that is a solid, over a part of a first plane of a substrate;
   forming a first conductive portion over a surface of the first insulating film; and
   forming a second insulating film which covers the first plane, the first insulating film, and the first conductive portion and whose moisture resistance is higher than moisture resistance of the first insulating film; wherein
   the forming the first insulating film includes forming in the first insulating film an opening portion which reaches the first plane;
   the forming the first conductive portion includes forming the first conductive portion over a top of the first insulating film and in the opening portion; and
   in the forming the second insulating film, a part of the second insulating film comes in direct contact with the first plane.

5. The semiconductor device fabrication method according to claim 4, wherein the forming the first insulating film includes:
   preparing a resist composition which contains a solvent containing resin obtained by hydrolyzing and condensing in the presence of acid or alkali alkoxy group-containing compounds having an alkoxy group bonded to a silicon atom or a germanium atom and whose portion irradiated with an energy beam is insoluble in developer;
   forming the prepared resist composition over the first plane of the substrate;
   irradiating a region of the formed resist composition corresponding to the part with the energy beam; and
   removing a portion of the resist composition not irradiated with the energy beam from over the substrate by the use of the developer.

6. The semiconductor device fabrication method according to claim 5, wherein:
   the alkoxy group-containing compounds are represented by $$R^1_{4-n}M(OR^2)_n \qquad (1)$$

where M is a silicon atom or a germanium atom, n is an integer of 1 to 4, $R^1$ is a hydrogen atom or a fluorine atom, or an alkyl group, a vinyl group, an alicyclic group, or an aryl group with one to eight carbon atoms, or a derivative thereof, $R^1$'s may be the same or different from one another at the time of n being smaller than or equal to 2, $R^2$ is a hydrogen atom, or an alkyl group, an aryl group, a vinyl group, or alicyclic group with one to eight carbon atoms, and $R^2$'s may be the same or different from one another at the time of n being greater than or equal to 2; and
   the resin is obtained by hydrolyzing and condensing at least one of the alkoxy group-containing compounds.

7. The semiconductor device fabrication method according to claim 5, the solvent contained in the prepared resist composition contains an acid compound or an alkali compound.

8. The semiconductor device fabrication method according to claim 6, wherein the derivative contains an aryl group.

9. The semiconductor device fabrication method according to claim 6, wherein the derivative has an ester bond or an ether bond.

10. A semiconductor device fabrication method comprising:
    forming a first insulating film that is a solid, over a part of a first plane of a substrate;
    forming a first conductive portion over a surface of the first insulating film;
    forming a second insulating film which covers the first plane, the first insulating film, and the first conductive portion and whose moisture resistance is higher than moisture resistance of the first insulating film; and
    forming a second conductive portion over the substrate; wherein
    the forming the first conductive portion includes forming the first conductive portion on a side of the first insulating film for arranging the first insulating film between the first conductive portion and the second conductive portion;
    the forming the second insulating film includes covering the first plane, the first insulating film, the first conductive portion, and the second conductive portion with the second insulating film; and
    in the forming the second insulating film, a part of the second insulating film comes in direct contact with the first plane.

* * * * *